Jan. 28, 1958 E. P. THIAS 2,821,622

BAND SWITCHING TELEVISION TURRET TUNER FOR VERY HIGH AND ULTRA-HIGH FREQUENCY BANDS

Filed Nov. 18, 1953 11 Sheets-Sheet 1

INVENTOR.
EDWIN P. THIAS

BY Ostrolenk & Faber

ATTORNEYS

Jan. 28, 1958 E. P. THIAS 2,821,622

BAND SWITCHING TELEVISION TURRET TUNER FOR VERY HIGH AND ULTRA-HIGH FREQUENCY BANDS

Filed Nov. 18, 1953 11 Sheets-Sheet 2

INVENTOR.
EDWIN P. THIAS

BY
Ostrolenk + Faber

ATTORNEYS

INVENTOR.
EDWIN P. THIAS
BY
Ostrolenk & Faber
ATTORNEYS

BAND SWITCHING TELEVISION TURRET TUNER FOR VERY HIGH AND ULTRA-HIGH FREQUENCY BANDS

Filed Nov. 18, 1953 11 Sheets-Sheet 4

INVENTOR.
EDWIN P. THIAS

BY
Ostrolenk & Faber

ATTORNEYS

INVENTOR.
EDWIN P. THIAS
BY
Ostrolenk & Faber
ATTORNEYS

INVENTOR.
EDWIN P. THIAS
BY
Ostrolenk & Faber
ATTORNEYS

Jan. 28, 1958 E. P. THIAS 2,821,622

BAND SWITCHING TELEVISION TURRET TUNER FOR VERY HIGH AND ULTRA-HIGH FREQUENCY BANDS

Filed Nov. 18, 1953 11 Sheets-Sheet 7

INVENTOR.
EDWIN P. THIAS

BY Ostrolenk & Faber

ATTORNEYS

INVENTOR.
EDWIN P. THIAS

BY

Ostrolenk & Faber

ATTORNEYS

Jan. 28, 1958 E. P. THIAS 2,821,622

BAND SWITCHING TELEVISION TURRET TUNER FOR VERY HIGH AND ULTRA-HIGH FREQUENCY BANDS

Filed Nov. 18, 1953 11 Sheets-Sheet 9

INVENTOR.
EDWIN P. THIAS

BY Ostrolenk & Faber

ATTORNEYS

Jan. 28, 1958 E. P. THIAS 2,821,622

BAND SWITCHING TELEVISION TURRET TUNER FOR VERY HIGH AND ULTRA-HIGH FREQUENCY BANDS

Filed Nov. 18, 1953 11 Sheets-Sheet 10

INVENTOR.
EDWIN P. THIAS

BY Ostrolenk & Faber

ATTORNEYS

INVENTOR.
EDWIN P. THIAS
BY Ostrolenk & Faber
ATTORNEYS

United States Patent Office 2,821,622

Patented Jan. 28, 1958

2,821,622

BAND SWITCHING TELEVISION TURRET TUNER FOR VERY HIGH AND ULTRA-HIGH FREQUENCY BANDS

Edwin Paul Thias, Los Angeles, Calif., assignor to Standard Coil Products Co., Inc., Los Angeles, Calif., a corporation of Illinois Application November 18, 1953, Serial No. 392,950

4 Claims. (Cl. 250—20)

My present invention relates to television tuners and more particularly it relates to discrete type tuners operable in the V. H. F. and U. H. F. ranges.

In co-pending application Serial No. 325,514, filed December 12, 1952, now Patent No. 2,773,986, a discrete type tuner was disclosed comprising two turrets mounted on concentric shafts of which one selected U. H. F. channels, the other V. H. F. channels. A switch was provided so that during U. H. F. reception the V. H. F. section of the tuner would be disconnected from the V. H. F. tuning elements connected to another group of tuning elements and would perform as an amplifier. When a V. H. F. channel was desired, this switch provided a connection between the tuning elements of the V. H. F. section and stationary mounted elements of the V. H. F. section.

In order to select a channel within a given band, U. H. F. or V. H. F., it was first necessary to switch in the desired band and then by operation of a second control the individual channel within that band was selected. In addition, fine tuning means were provided in both the U. H. F. and V. H. F. section to fine tune after discrete selection of the desired channel.

In other words, the switch contacts must be capable of providing good electrical connections at two different points, one point corresponding to the connection with the V. H. F. turret, the other point corresponding to the connection with the auxiliary circuit.

One object of the present invention is, therefore, a contact member capable of making contact at two different positions.

The contact of the present invention is essentially a long flat spring member channeled in the longitudinal direction and appropriately preloaded so as to maintain even contact pressure regardless of the free position of the contact member itself. The longitudinal channeling on the flat spring is provided so as to make the spring member fairly stiff but is not done through the whole length of each contact but only up to a predetermined length so that the rest of the contact is quite resilient. Because of this construction and the length of the contact members, it is found that considerably less fatigue of the spring member and less resistance to tuning of the turret is encountered by using this particular shape for the contact members.

Another and more specific object of the present invention is, therefore, the provision of means whereby a turret can be rotated with small resistance to the turning action and still maintain adequate contact pressure to insure proper electrical performance.

The position of the previously mentioned switch was determined by the U. H. F. turret so that in one position of the U. H. F. turret the switch would take a certain position while in all the other positions of the U. H. F. turret, the switch would take a second position.

The control mechanism of the switch mechanism consists in the present invention of a cam surface forming an integral part with the U. H. F. turret engaging a cam follower having a shaft positioned so that it can operate the switch to either of its two positions. The cam follower and the shaft are appropriately biased against the cam surface, and the cam surface in this particular embodiment has a number of similar notches and two dissimilar notches. One of the dissimilar notches causes the cam follower and, therefore, the switch structure to take the position corresponding to V. H. F. reception under all conditions. The other dissimilar notch through operation of a sliding member may cause the cam follower and therefore the switch structure to take the position for either V. H. F. or U. H. F. reception.

Accordingly, another object of the present invention is the provision of means for controlling the position of a switch through rotation of a turret.

It may be necessary at this point to recall the fact that there are 12 V. H. F. channels numbered 2 to 13, inclusive, in addition to the U. H. F. channels 14 to 84. The 12 V. H. F. channels occupy a frequency range extending from 54 megacycles (channel 2) to 216 megacycles (channel 13). The U. H. F. channels instead occupy a frequency range from 470 to 890 megacycles.

If then (1) a desired system of tuning is used, that is one in which the television frequency range is divided in bands of 10 channels each, for example, band 3 comprises channels 30–39, and (2) if the U. H. F. and V. H. F. tuning means are different and separate but the same channel positioning means are used for both V. H. F. and U. H. F. channels, and (3) in view of the fact that there are 12 V. H. F. channels, the cam mechanism for operating this switch must be such that it will be possible to tune from V. H. F. channel 13 to U. H. F. channel 14 by continuous rotation of one member without having to operate other control means for selection of the U. H. F. or V. H. F. ranges.

Another object of the present invention is, therefore, the provision of control means which permit simple passage from V. H. F. to U. H. F. reception.

This is obtained in the present invention by the use of a novel cam surface which provides under certain operating conditions a number of positions for its cam follower and which under other operating conditions provides other positions either previously non-existent or similar to the above mentioned ones.

Specifically, in this invention the cam mechanism consists of a cam surface provided, as previously mentioned, in view of the application of this cam to this particular U. H. F.-V. H. F. tuner, with a number of notches, equal in depth, and two notches extending more deeply toward the center of rotation of the cam surface. Actually a cam surface having essentially two diameters would suffice for the switching operation since one would take care of U. H. F. operation and the other of V. H. F. operation.

Individual notches for the U. H. F. positions permit as described hereinafter a cleaning action of the switch contacts.

The cam surface is mounted on the U. H. F. turret and one of the U. H. F. notches is made slidable so that its position is determined by the angular position of another cam surface, in this case a circular sector, positioned in the interior of the first cam surface and having as its follower the slidable notch. The second cam surface establishes only two positions to the slidable notch member.

The operation of this cam, when applied to the present V. H. F.-U. H. F. tuner, is the following: channels 2–13 are obtained by setting the U. H. F. turret in the V. H. F. reception position, and the V. H. F. turret is then rotated for selection of these V. H. F. channels. In this case the U. H. F. turret is inoperative and the switch contacts engage the V. H. F. turret.

A problem arises when the decade type of dialing is used, that is when a dial system is used in which after the ninth unit digit a new digit appears in the tens place. This system is from the operator's point of view the simplest since the operator is generally accustomed to this type of rotation and dialing.

The problem is essentially this: There are 12 V. H. F. channels numbered from 2 to 13 which require V. H. F. tuning elements, and there are also 70 U. H. F. channels numbered from 14 on which require U. H. F. tuning elements. This means that part of the channels between channels 10 and 19 are at V. H. F., part at U. H. F., and that, accordingly, if one uses V. H. F. tuning elements one can only go up to channel 13 and no further, and if one uses U. H. F. tuning elements he can go only down to channel 14 and no lower. This necessitates the use of individual tuning elements, one for V. H. F. channels 10 to 13, the other for U. H. F. channels 14 to 19 with a switch to disconnect the V. H. F. elements and connect the U. H. F. elements when the operator turns the dial from 13 to 14, and increases when the dial is turned from 14 to 13.

While this switching operation occurs within the tuner, the dial must provide an indication of whether the operator is now tuning in the U. H. F. or V. H. F. region.

In other words, due to the decade system used in U. H. F., channels numbered 10–13 would appear in the dial once as V. H. F. and once as U. H. F. channels. This problem is overcome by my present cam mechanism as follows:

Considering first for example the tuning procedure to be followed to tune in channel 10, the U. H. F. turret is tuned by one step so that the slidable notch is engaged by the switch operating cam follower. This would cause operation of the switch contacts from engagement of the V. H. F. turret to engagement of an auxiliary assembly which, as described hereinafter, serves to transform the U. H. F. section of the present tuner into an I. F. amplifier. But since the V. H. F. turret has now been moved from position 9 to position 0, the second cam surface movable with the V. H. F. turret does not engage the slidable notch which, therefore, under the pressure of the switch control cam follower will occupy a lower position similar in depth to the V. H. F. notch so that the switch remains in the V. H. F. turret engagement position.

When the V. H. F. turret is tuned from V. H. F. channel 13 to U. H. F. channel 14, the circular sector engages the slidable notch and moves it to its outer position so that it is undistinguishable from the other U. H. F. notches. Now the switch is operated and its contacts correspondingly move from engagement with the V. H. F. turret to engagement with the auxiliary assembly to transform the V. H. F. section into an I. F. amplifier.

From channel 14 on the switch will retain this position.

If, on the other hand, only V. H. F. channels are desired, the operator when going from channel 9 to 10 need not move the U. H. F. turret to its position 1, but continues to rotate the V. H. F. turret up to channel 13. From channel 13 the operator may return to channel 2 or by rotating the U. H. F. turret to its position 1 and the V. H. F. turret to the position corresponding to U. H. F. channel 14 he can tune to channel 14 and to all other U. H. F. channels.

It was mentioned that the cam surface instead of being flat for all the U. H. F. positions and having a different configuration for the V. H. F. position is provided with individual notches for each of the U. H. F. positions so that when the U. H. F. turret is rotated during U. H. F. reception the switch assembly is made to wipe the contacts at each step of the U. H. F. turret to maintain the contacts as clean as possible.

During V. H. F. reception as the V. H. F. turret is rotated, the detent positioning disc at the center of the V. H. F. turret is made to engage also a roller positioned on the switch assembly so that at each step of the V. H. F. turret the switch structure is again caused to move and to wipe its contacts.

Another object of the present invention is, therefore, the provision of means for wiping the switch contacts during both U. H. F. and V. H. F. selection.

In addition, as disclosed in the above mentioned application, the panels forming the U. H. F. turret may be made of plastic material; that is, they may be moldings having a set of stationary capacitor plates molded in them.

The complete turret assembly consisting of a U. H. F. and a V. H. F. turret and their shafts is mounted in the tuner chassis which is essentially divided also in two sections, the U. H. F. section and the V. H. F. section separated appropriately by a shield.

The chassis is provided at its two end walls with pockets obtained through stamping of the metallic chassis so that a simple spring clip without any hooks can be used to engage the two ends of the operating shafts and the above mentioned pockets of the chassis to securely mount the turret assembly against movement of the turret assembly away from the chassis. That such a movement away from the chassis may be possible without the use of these spring clips is obvious when it is considered that in the present tuner two detent discs are used requiring, therefore, two spring members provided with rollers biased against the notches of the positioning discs. In addition, the stationary contact structures will also tend to bias the turrets away from the chassis.

Therefore, another object of the present invention is the provision of means for securedly mounting a rotatable turret to its housing.

In addition to the turret structures, the present tuner is provided with, as previously mentioned, fine tuning means, one for fine tuning in U. H. F. channels, the other for fine tuning in V. H. F. channels.

The fine tuners are essentially capacitors, the capacitance variation of which is obtained by moving a dielectric plate with respect to the two conductive plates of the capacitor assembly. The two dielectric plates are mounted on a single shaft and operated by rotation of a sleeve concentric with the shafts of the turrets.

The coupling means between the sleeve and the fine tuning shaft consists of a friction disc device mounted on the sleeve and two friction members mounted on the fine tuning shaft. The two friction members are identical and provided at one end with a stop obtained by stamping so that by using the same stamping it is possible to obtain both friction members which are then positioned one facing the other with one stop member at each end.

The function of the stop members is to stop the rotation of a shaft at certain angular values even when the controlling shaft is rotated beyond these angular values.

Accordingly, another object of the present invention is the provision of means for stopping the rotation of a shaft obtainable by a simple stamping operation.

It was mentioned before that the two sections of this tuner are electrically separated from each other by means of a shield. It should be noted that in addition to this shielding effect, the antenna segments of the V. H. F. turret are shielded from the oscillator segments of the V. H. F. turret through the detent positioning disc positioned between the two halves of the turret and a complementary shield mounted on the chassis.

The chassis itself is also provided with a system of grounding contacts so as to ground the detent disc through a low resistance path and improve the shielding effect between the antenna section and the oscillator section of the V. H. F. tuner.

A similar shielding effect is obtained in the U. H. F. turret by means of a wiper contact mounted on the chassis which engages the extensions of a shielding disc between the oscillator and the preselector of the U. H. F. tuner. Thus, the U. H. F. tuner is provided with a shielding member to reduce oscillator radiation effect at U. H. F.

The shielding disc of the U. H. F. turret is a metallic circular member provided with radially extending fingers which engage the previously mentioned wiping contacts mounted on the chassis to thus effectively ground through a low resistance path the shielding disc of the U. H. F. turret.

Another object of the present invention is, therefore, the provision of means for shielding the oscillator section from the antenna or preselector section in both the U. H. F. and V. H. F. tuners.

The U. H. F. panels described above are mounted on two supporting discs rigidly secured to a sleeve concentric with the shaft of the V. H. F. turret. One of these mounting discs is provided with extending fingers to engage an opening at one end of the panels. The other disc is provided with notches which are engageable by a protruding member of the U. H. F. panels. This second disc is metallic and its notches also serve for positioning purposes when engaged by an appropriate detent mechanism.

The extension of the U. H. F. panels is provided with shoulders such that a spring member mounted on the outside of this turret on the second disc and having a circumferentially bent portion engages the shoulders of the extension of the U. H. F. panels so that the bent portion of this spring biases these panels against the second disc.

Removal of the panels from the turret can then be obtained by moving the panel away from the turret in the radial direction, overcoming the opposition presented by the disc mounted spring member.

Accordingly, another object of the present invention is the provision of means for simply securedly and economically mounting the panels carrying electrical elements on a turret.

Such positioning means are particularly necessary at ultra-high frequencies where it is well-known any slight displacement with respect to a preselected position of the panels may cause detuning and consequent loss of picture.

Another mechanical feature of the present invention is the positioning of the oscillator tube of the U. H. F. section at an angle with respect to the vertical direction so as to permit not only the mounting of the tuner near the cathode ray tube but also adjustment of elements mounted on the same side of the tuner on which the tubes are mounted.

Another object of the present invention is, therefore, the provision of means for mounting a tuner as close as possible to the front end of the television receiver in proximity to the cathode ray tube.

Electrically the tuner disclosed in the above mentioned application consisted in the V. H. F. section of a tuned R. F. amplifier (of the cascode type), a triode oscillator and a pentode converter. The input signal was applied to the R. F. amplifier through a tuned circuit consisting of a transformer mounted on a panel of the V. H. F. turret so that the center contact of the panel was connected to ground, the two contacts immediately adjacent the center contact were connected to the primary of this transformer and the remaining two contacts were connected to the input of the R. F. amplifier when the particular panel was in operative condition.

While this shows a symmetrical mount, it was found that the capacity to the secondary of this transformer could be reduced greatly by mounting these primary and secondary coils in the following manner: namely, the grounding contact still in the middle of the panel, the antenna coil or the primary coil on one side of this ground and the secondary or tuned coil on the other side of this ground. Since now the antenna coil and the tuned coil are separated by ground, the capacity into the secondary is greatly reduced and a high degree of isolation is obtained.

It should be noted also that in the present invention the primary coil is wound as a reverse helix. During V. H. F. operation then the V. H. F. antenna and antenna circuit are connected across the primary of this transformer while the input to the R. F. amplifier is connected to the secondary of this transformer.

During U. H. F. reception, on the other hand, since it is desired to use the V. H. F. circuitry essentially as an I. F. amplifier and in order that V. H. F. signals will not interfere with the received U. H. F. signals, provision is made for the U. H. F.-V. H. F. switch to short to ground the two antenna terminals, that is, the terminals across which during V. H. F. operation is connected the primary of the V. H. F. input transformer.

During U. H. F. operation this oscillator tube of the V. H. F. section is rendered inoperative while the converter tube is used also as an I. F. amplifier together with the previously mentioned R. F. cascode amplifier.

The input circuit of the present tuner during U. H. F. reception consists of the U. H. F. antenna connected to a circuit mounted on the chassis which may be called a filtering circuit consisting of inductances and capacitances and ending as a preselector tunable circuit in which channel tuning action is obtained by motion of a dielectric plate between conductive plates mounted in the U. H. F. panels.

The U. H. F. signal is then applied to a crystal converter one end of which is held through spring action in contact with one end of an insulated metallic U-shaped bracket. The other end of this bracket is the flexible member of a compression type adjustable capacitor, said capacitor being in the ground return path of the mixer tuned circuit. Adjustment of this capacitor provides a change in impedance of the point to which the mixer is connected.

The oscillator of the U. H. F. section is also provided with a tuning element consisting of a rotatable dielectric plate for channel selection and conductive plates mounted on the U. H. F. panels. The output from the oscillator is applied to the mixer through an injecting device which is mounted on the panels and consists essentially of a metallic rod with a probe at each end. One probe is coupled to the output of the oscillator, and the other probe is coupled to the tuned circuit in the input of the crystal mixer.

The output from the U. H. F. tuner is connected by means of a section of transmission line to the input terminals of the R. F. cascode amplifier which now operates as previously mentioned as an I. F. amplifier.

It should be noted that the oscillator is also provided with an additional tuning device which again, as previously mentioned, serves to fine tune within each V. H. F. and U. H. F. channel.

In the preselector described in the above mentioned application, individual coupling capacitors were connected across each set of the preselector outer stator plates. In the present invention, on the other hand, it was found that one constant band width coupling capacitor may be used for the whole range of operation of the U. H. F. tuner.

In addition, it was found that the capacitances required for the previously mentioned input filter may be obtained by placing a series of dielectric plates one against the other with metal plates positioned between them, the metal plates being the conductive plates of the filter capacitors. Such a filter capacitor assembly may be held together by means of an insulating screw such as a nylon screw.

Another object of the present invention is the provision of a filtering circuit in the input of the U. H. F. tuner.

Still another object of the present invention is a novel capacitor assembly.

A further object of the present invention is the provision of means for varying the capacity across which the input of a mixer is connected.

To summarize the above, the tuner embodying the present invention is provided with two independent antenna circuits, one for U. H. F. reception, the other for V. H. F. reception. During V. H. F. reception the output from the U. H. F. section is disconnected from the input to the I. F. amplifier and the V. H. F. antenna is connected through an appropriate input transformer to the input of a radio frequency cascode amplifier, the output of which is mixed with the signal from the V. H. F. oscillator in a converter, the output of which is at the desired intermediate frequency of either 21 megacycles or 41 megacycles.

During U. H. F. reception, on the other hand, the V. H. F. antenna is open circuited while the U. H. F. circuit is operative and provides at the output of a crystal mixer an intermediate frequency signal which is applied to the input of the cascode amplifier of the V. H. F. section now operating as an intermediate frequency amplifier and is passed through the converter operating now as an amplifier so that at the output of the V. H. F. section now appears the amplified intermediate frequency corresponding to the received U. H. F. signal.

The switching operation between V. H. F. and U. H. F. is obtained by a cam mechanism operated by the U. H. F. turret which causes the switch to occupy either one of two positions, (1) the position at which the switch contacts engage the V. H. F. turret, from now on will be denoted as the V. H. F. position, and (2) when the contacts engage an auxiliary circuit and are disconnected from the V. H. F. turret. The second position will from now on be referred to as the U. H. F. position of the switch.

The electrical operation of the U. H. F. tuner and V. H. F. tuner is similar to the one described in the above mentioned application, except for the improvements and modifications mentioned above.

The foregoing and many other objects of the invention will become apparent in the following description and drawings in which:

Figure 1 is a circuit diagram of the tuner of the present invention.

Figure 2 is an exploded view of the tuner of the present invention showing the chassis of the tuner and the elements mounted on the chassis and the V. H. F.-U. H. F. turrets.

Figure 2*a* is a side view of the tuner of the present invention showing the positioning means and the fine tuning mechanism.

Figure 3 is a top view of the tuner of the present invention showing the U. H. F. crystal mounting means and the U. H. F. and V. H. F. inputs.

Figure 4 is a detail view of the terminal of the V. H. F. section connections taken along line 4—4 of Figure 3 looking in the direction of the arrows.

Figure 5 is a top view of a detail of the tuner of the present invention showing the U. H. F. input filtering means and the crystal mounting means. In this figure the upper part of the U. H. F. chassis has been removed.

Figure 6 is a detail view of the crystal mounting means and crystal of the U. H. F. tuner taken at line 6—6 of Figure 3 looking in the direction of the arrows.

Figure 7 is a side view of the U. H. F. turret with all the U. H. F. panels removed except one.

Figure 8 is a top view of one embodiment of the U. H. F. panels.

Figures 11, 12:
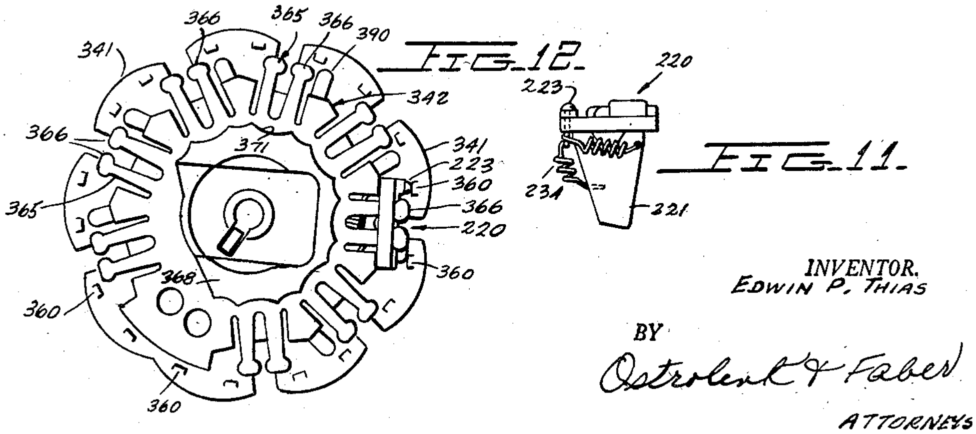
Figure 11 is another side view of the panels of Figure 8.

Figure 12 is the rear view of the U. H. F. turret.

Figure 13:
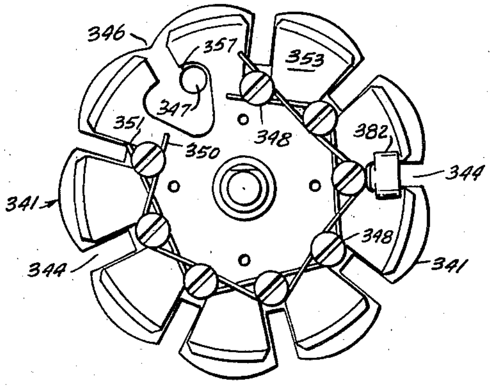

Figure 13 is the front view of the U. H. F. turret showing one U. H. F. panel mounted, the panels biasing spring member and the adjusting screws.

Figure 14:
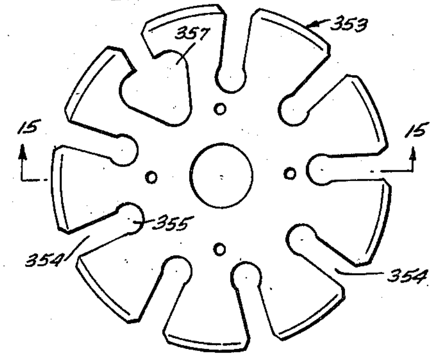

Figure 14 is a front view of the spring member used in the supporting disc of Figure 13.

Figure 15:
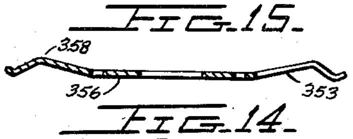

Figure 15 is a cross-sectional view taken at line 15—15 of Figure 14 of the spring member of the supporting disc shown in Figure 13.

Figures 2A, 36, 37:
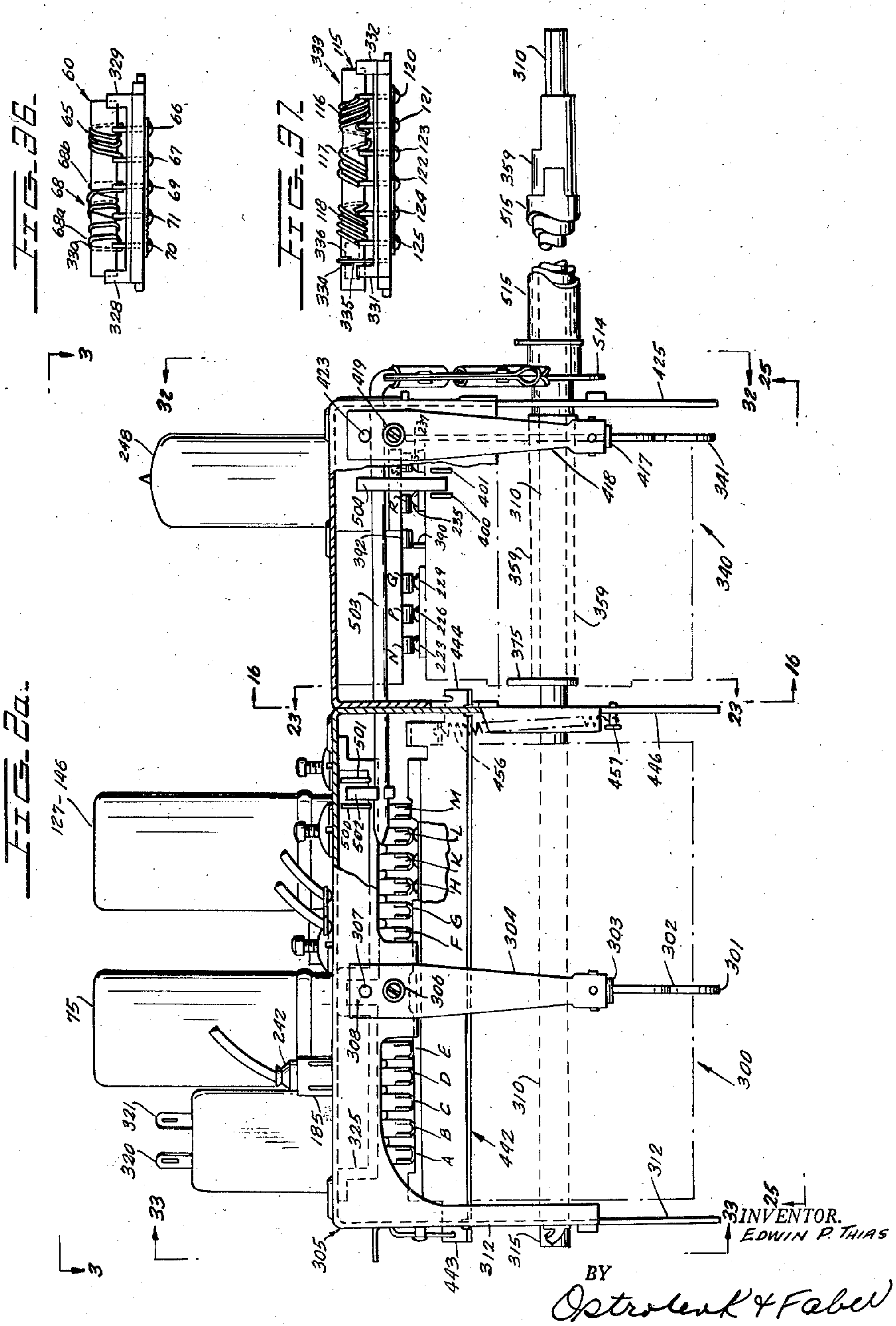
Figures 16, 17, 18, 19, 20, 21, 22:
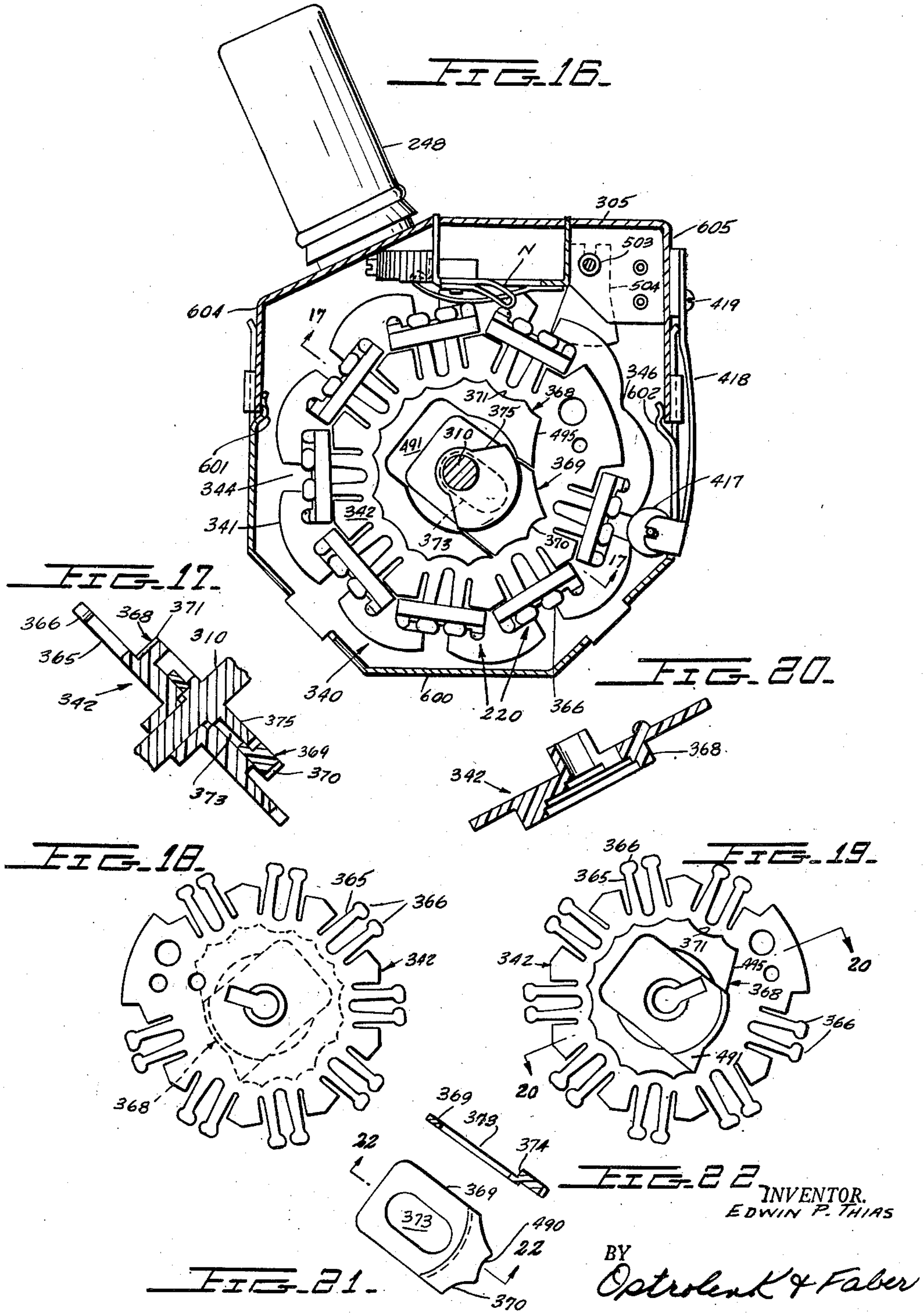

Figure 16 is a cross-sectional view taken at line 16—16 of Figure 2*a* looking in the direction of the arrows and showing the cam carrying portion of the U. H. F. turret.

Figure 17 is an assembly drawing taken at line 17—17 of Figure 16 looking in the direction of the arrows.

Figure 18 is a detail view of the cam supporting disc of the U. H. F. turret.

Figure 19 is another view of the disc of Figure 18.

Figure 20 is a cross-sectional view taken at line 20—20 of Figure 19 looking in the direction of the arrows.

Figure 21 is a detail view of the movable member of the cam mechanism of the present invention.

Figure 22 is a cross-sectional view taken at line 22—22 of Figure 21 looking in the direction of the arrows.

Figure 2:
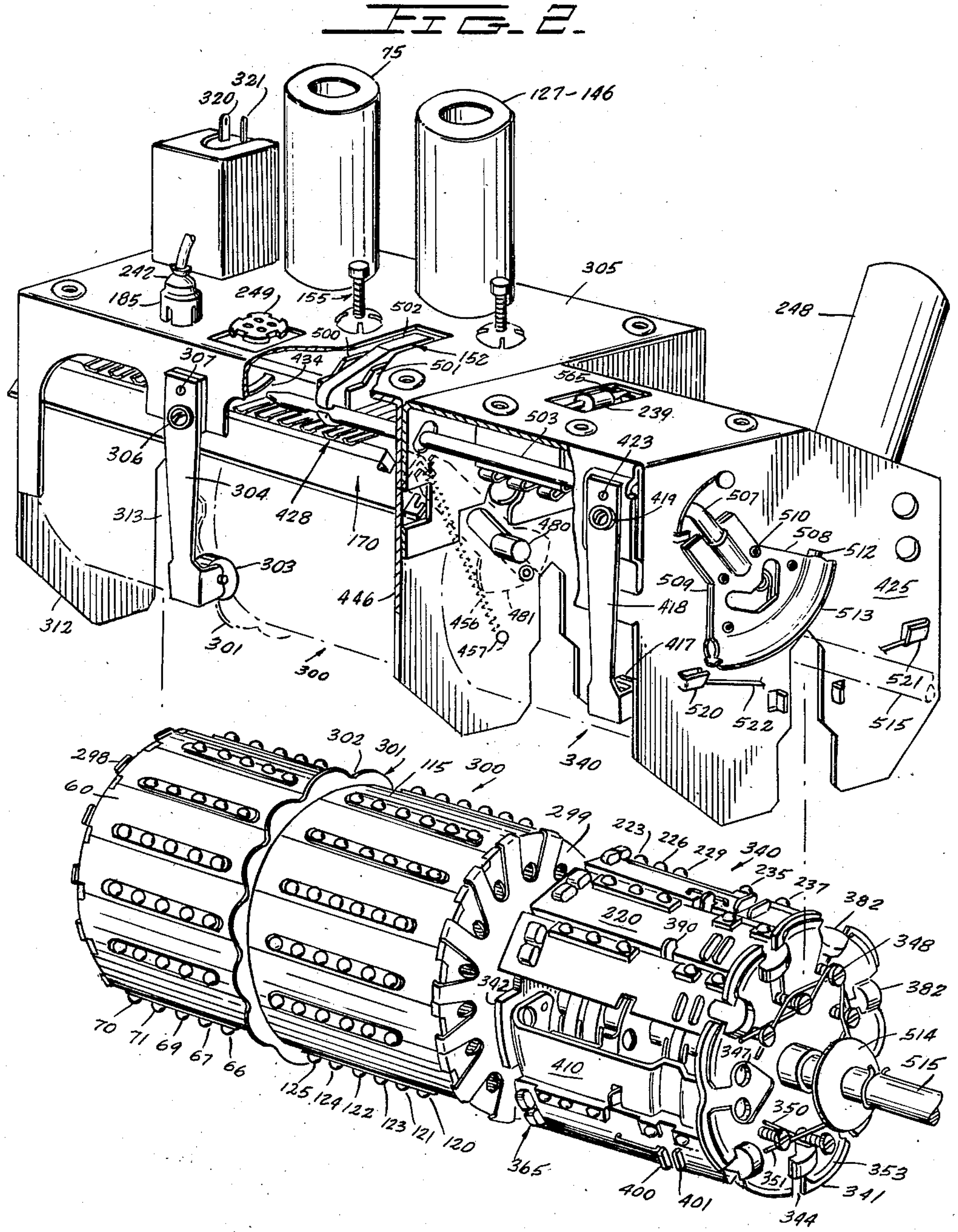
Figures 23, 24:
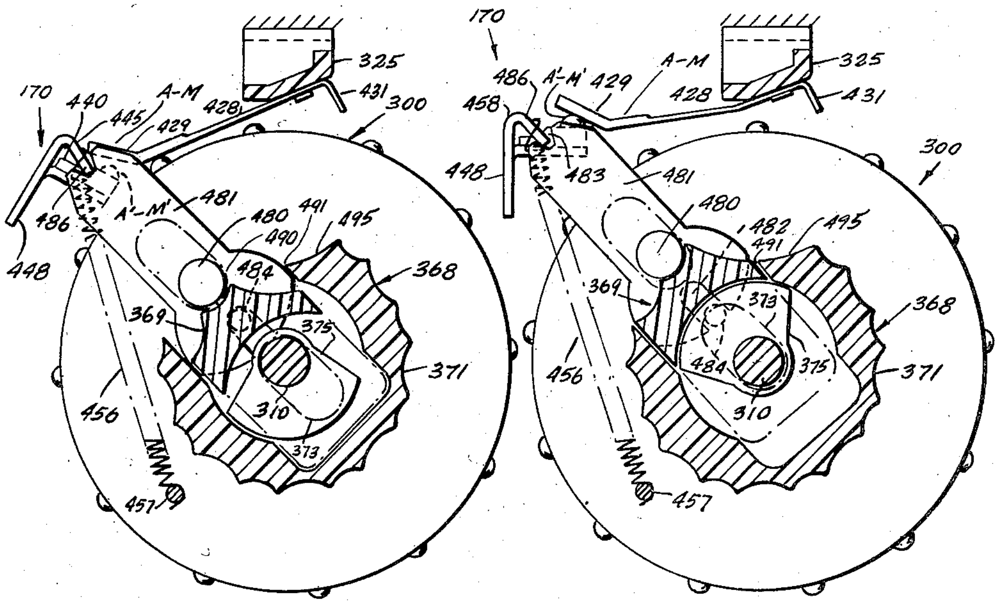

Figure 23 is a view taken at line 23—23 of Figure 2 looking in the direction of the arrows and showing the cam mechanism during V. H. F. reception of channels 10–13.

Figure 24 is a view similar to that of Figure 23 showing the cam mechanism during U. H. F. reception of channels 14–19.

Figure 25:
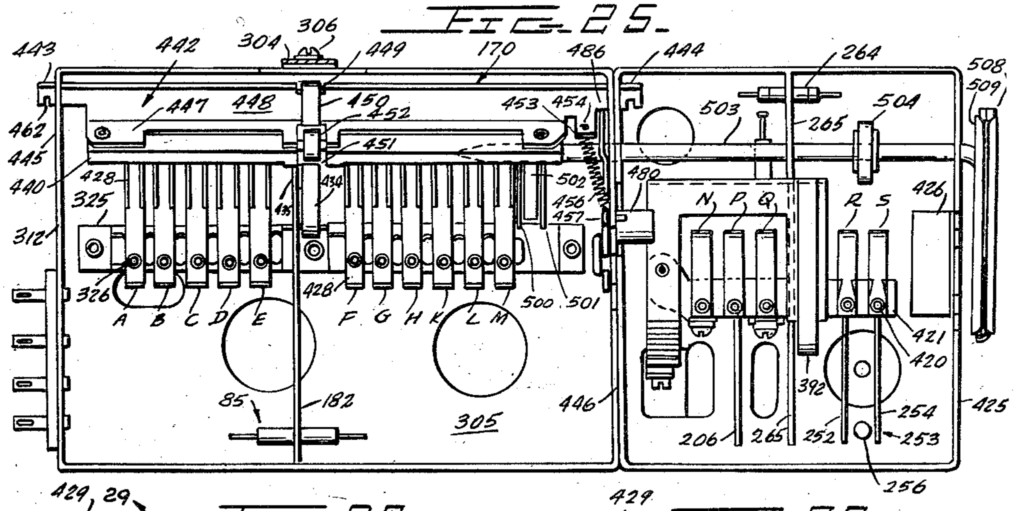

Figure 25 is a cross-sectional view taken at line 25—25 of Figure 2 looking in the direction of the arrows.

Figure 26:
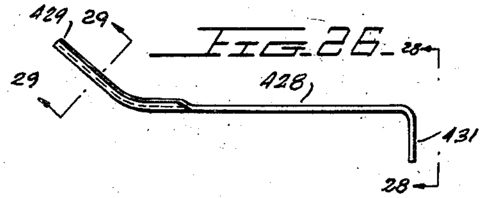

Figure 26 is a side view of the stationary contacts of the V. H. F. turret.

Figure 27:
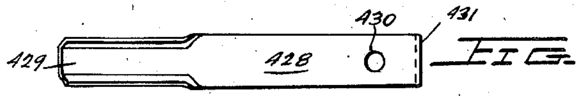

Figure 27 is a top view of the contacts of Figure 26.

Figure 28:
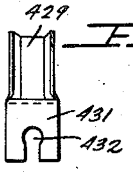

Figure 28 is a side view of the contacts of Figure 26 taken at line 28—28 looking in the direction of the arrows.

Figure 29:
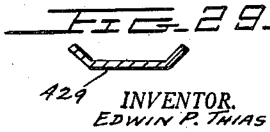

Figure 29 is a cross-sectional view taken at line 29—29 of Figure 26 looking in the direction of the arrows.

Figure 30:
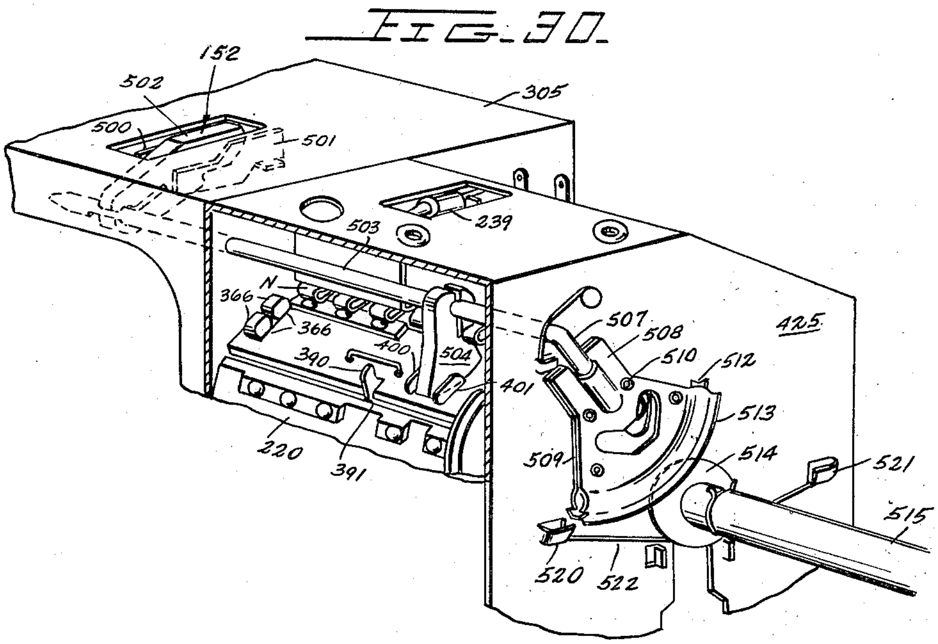

Figure 30 is a partly broken away view of the tuner of the present invention showing the fine tuner mechanism in an intermediate position.

Figure 31:
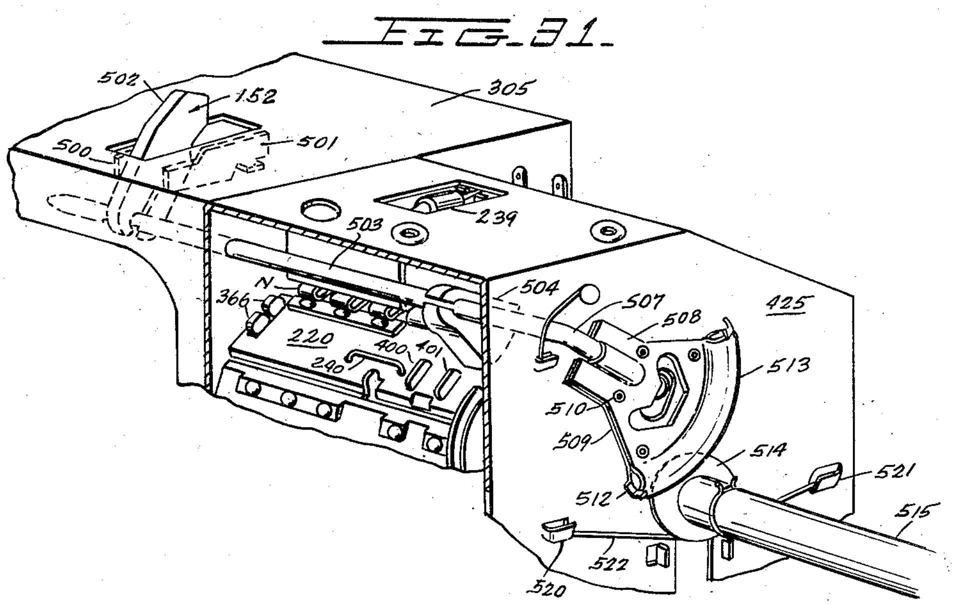

Figure 31 is a view similar to Figure 30 showing the fine tuning mechanism at one of its end positions.

Figure 32:
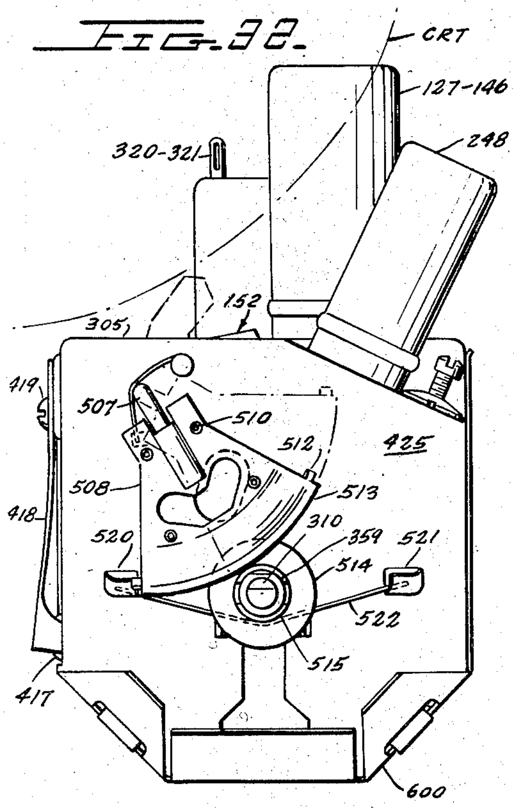

Figure 32 is a front view of the tuner of the present invention showing the friction elements of the fine tuning mechanism and the turret mounting means.

Figure 33:
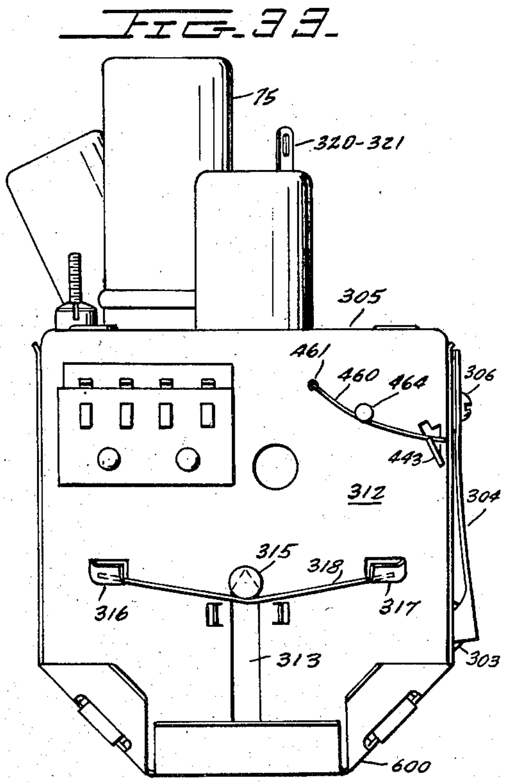

Figure 33 is an end view of the tuner of the present invention showing the switch biasing means and the turret retaining means.

Figure 34:
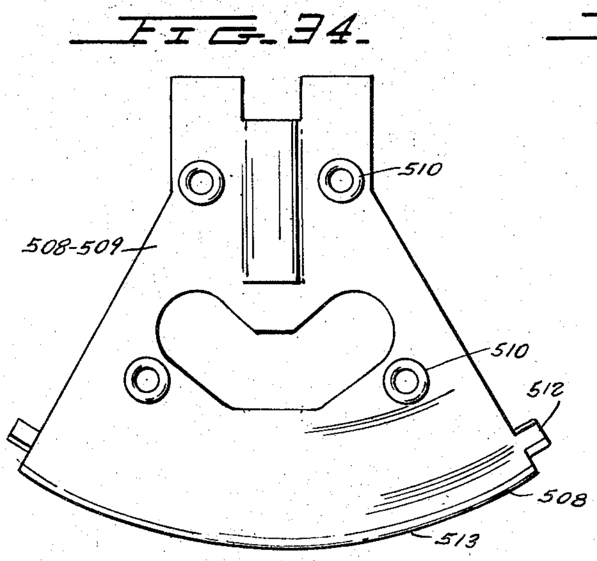

Figure 34 is a detail view of the friction members for controlling the fine tuner of the present invention.

Figure 35:
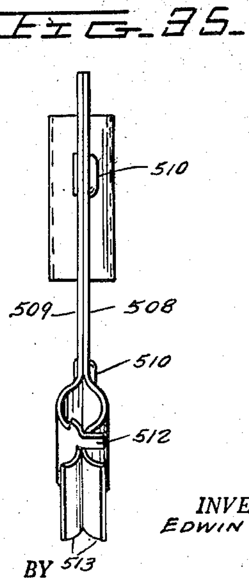

Figure 35 is a side view of the friction elements of Figure 34.

Figure 36 is a front view of a V. H. F. antenna panel.

Figure 37 is a front view of a V. H. F. oscillator converter panel.

Figure 38:
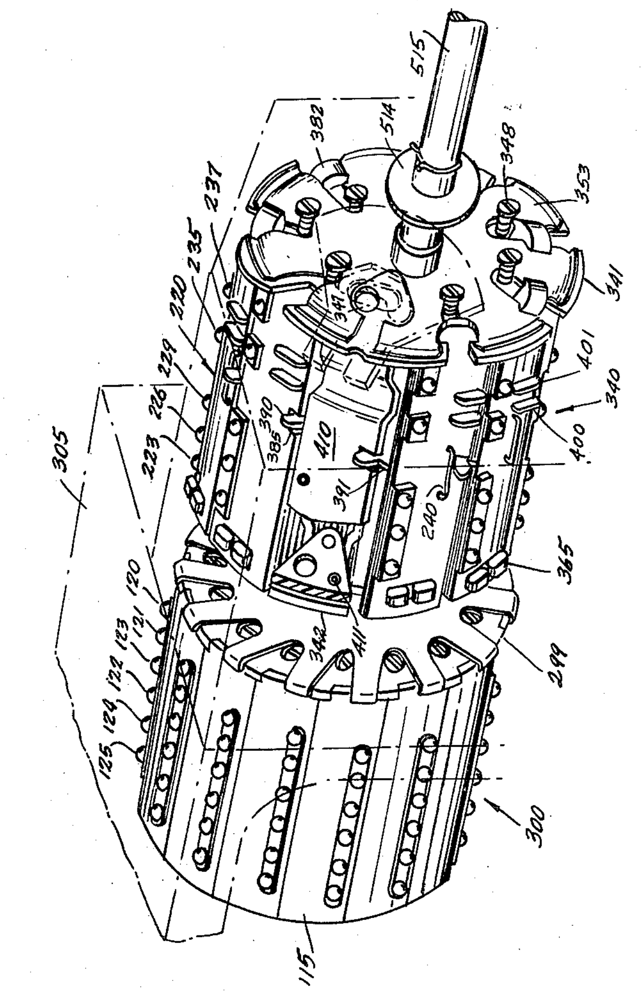

Figure 38 is a perspective view of the U. H. F. and V. H. F. turrets showing how the V. H. F. oscillator may be trimmed from the front end of a television tuner during V. H. F. reception.

Figure 39A:
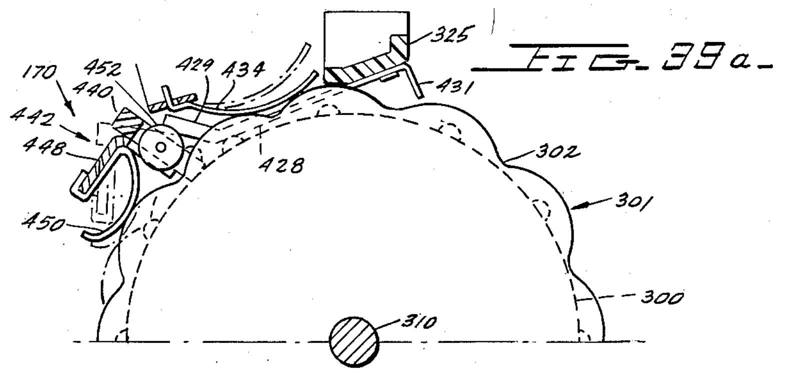

Figure 39*a* is a cross-sectional view of the V. H. F. turret at the positioning disc showing the position of the wiping control roller when the V. H. F. turret is set for reception of a V. H. F. channel.

Figure 39B:
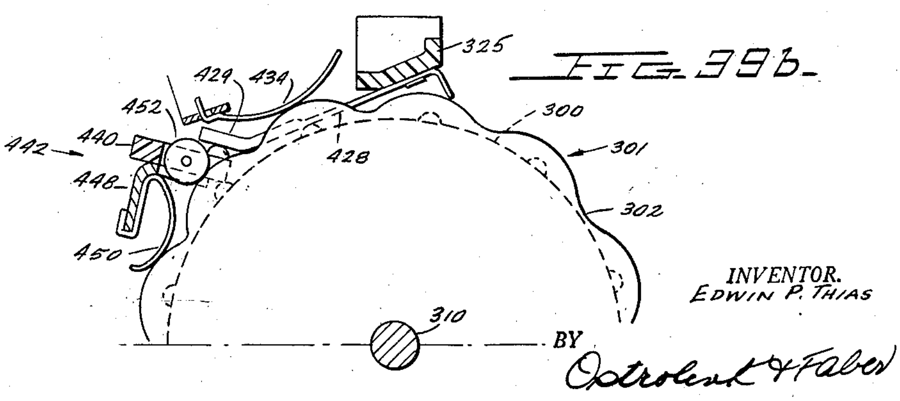

Figure 39*b* is a view similar to that of Figure 39*a* showing the position of the roller, the auxiliary assembly and the switch contacts when the V. H. F. turret is in an intermediate position between two channels.

Figures 40, 41:
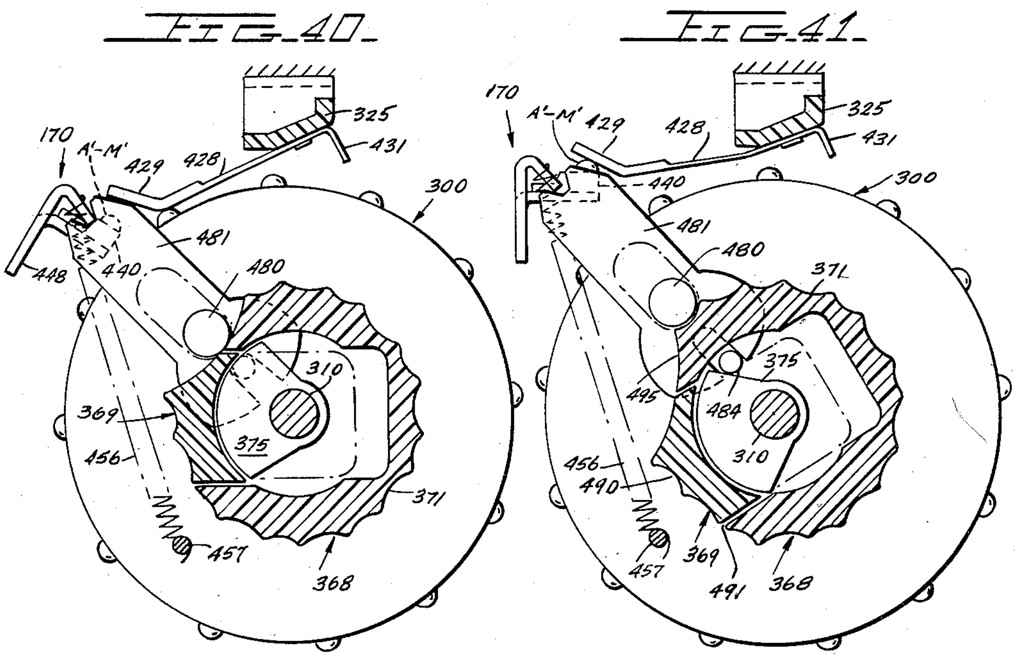

Figure 40 is a view of a cam mechanism of the present invention showing the position of the cam members during V. H. F. reception.

Figure 41 is a view of the cam mechanism similar to that of Figure 40 showing the cam members during U. H. F. reception.

Figures 3, 4, 5, 6, 42:
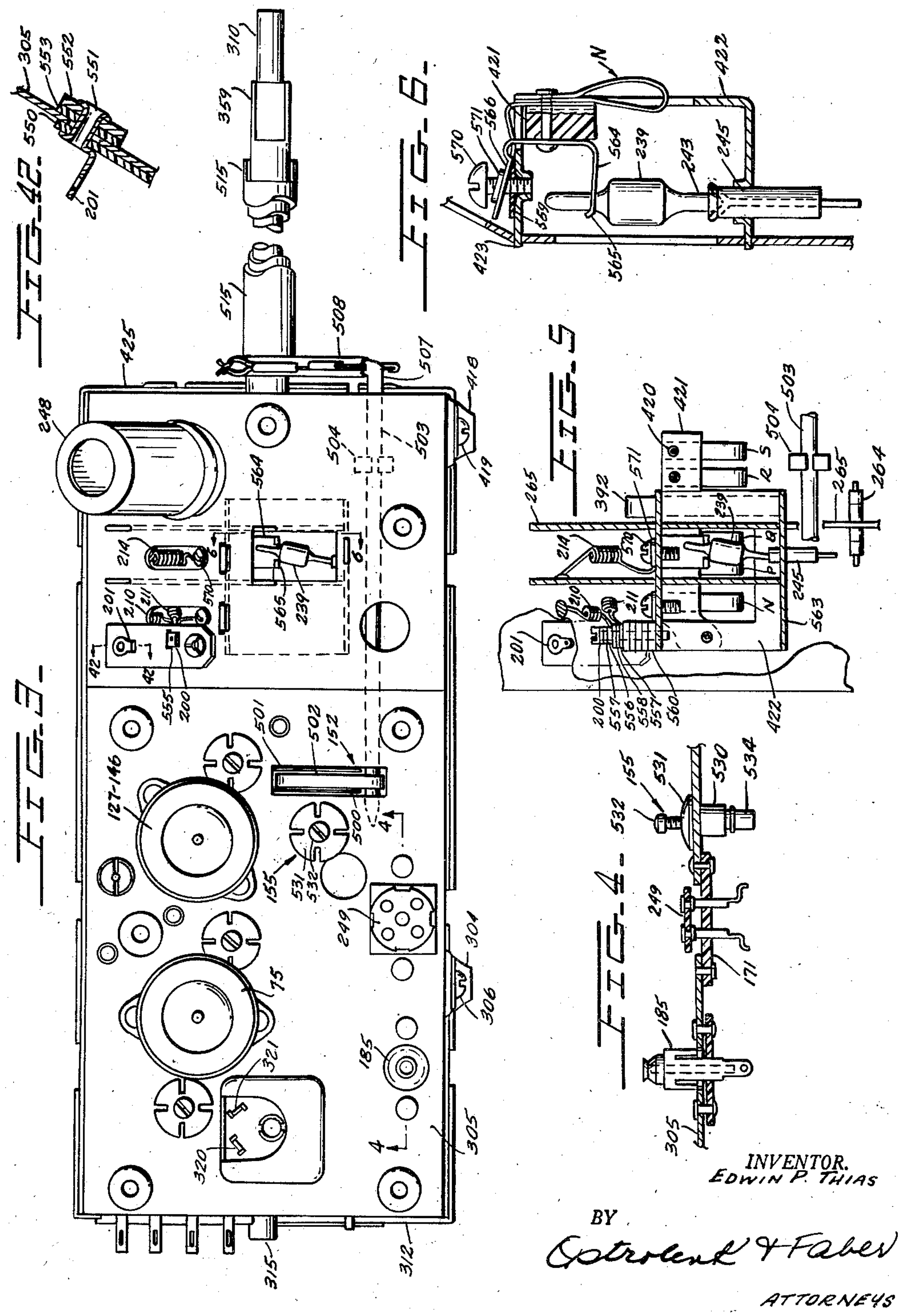

Figure 42 is a cross-sectional detail view taken at line 42—42 of Figure 2 and looking in the direction of the arrows.

Figure 1:
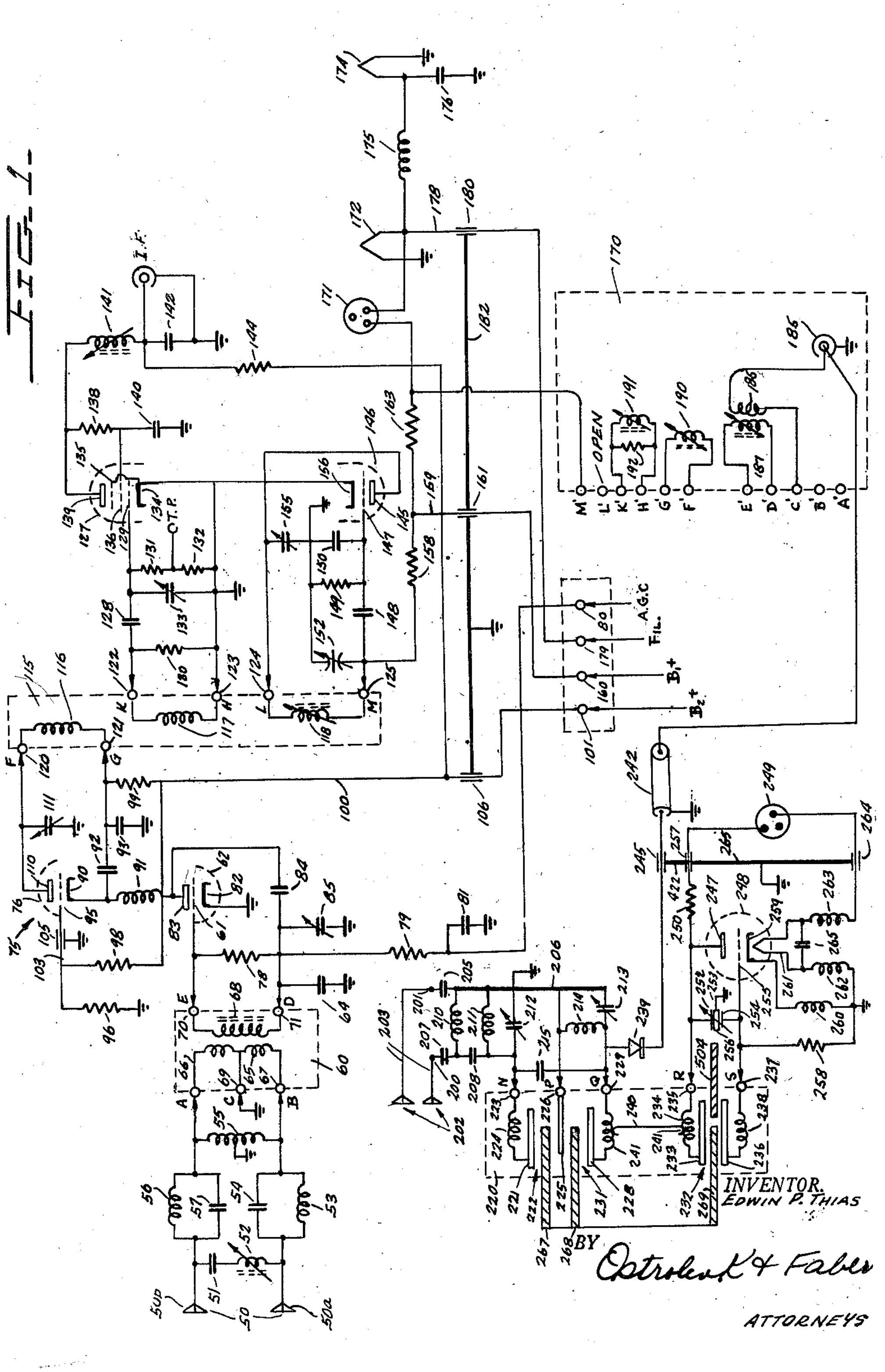

Referring first to Figure 1 showing the schematic circuit diagram of the present U. H. F.-V. H. F. tuner, the V. H. F. antenna 50 which is shown here as a balanced antenna is connected to a series circuit consisting of a capacitance 51 and a variable inductance 52. Variable inductance 52 may consist of a coil with a conductive slug within it so that displacement of the slug with respect to the coil produces the desired variation in inductance. Across the balanced output of this coil assembly is placed a balanced center topped coil (iron core) 55.

To be more specific, section 50*a* of V. H. F. antenna 50 is connected to the free end of inductance 52 while the other side, 50*b*, of antenna 50 is connected to the free end of capacitor 51.

Antenna section 50*a* is also connected to a parallel circuit consisting of an inductance 53 and a capacitance 54. The other side of the parallel circuit 53—54 is connected to a fixed terminal B. Similarly, section 50*b* of antenna 50 is connected to the parallel circuit consisting of inductance 56 and capacitance 57. This parallel circuit is connected on the other side to a stationary contact A.

It should be noted that aside from the antenna 50 and the transmission line from the antenna to the series circuit 51—52, the other components described above are fixedly mounted on the chassis of the tuner as shown hereinafter in connection with Figures 2 and 3.

When the tuner is set for V. H. F. reception, that is, for reception on an individual V. H. F. channel, an antenna segment 60 mounted on the V. H. F. turret also described hereinafter is connected to the fixed terminals A and B and the other fixed terminals C, D, E on the input side of the V. H. F. tuner.

Contact C is a fixed contact connected to ground. Contact E is connected to the grid 61 of grounded cathode triode 62. Contact D is connected to ground through by-passing capacitor 64.

Mounted on panel 60 is an input transformer having its primary side 65 balanced to ground through connection of its two ends to stationary contacts A and B respectively by means of appropriate movable contacts 66 and 67 mounted on panel 60.

Primary coil 65 is center tapped and the center tap is connected to a movable contact 69 which in turn engages contact C, thus grounding the center tap of coil 65. Also mounted on panel 60 is a secondary 68 of transformer 65—68. Secondary 68 has its terminals connected to movable contacts 70 and 71, which engage the stationary contacts E and D respectively.

It will now be apparent that the transformer 65—68 mounted on panel 60 serves not only as an input coupling device, but also as a means for transforming a balanced input signal into an unbalanced signal. The unbalanced signal which appears across stationary contacts E and D is supplied to the grid 61 of grounded cathode triode 62 of R. F. amplifier 75. R. F. amplifier 75 consists of two triodes 62 and 76 connected in cascode.

To be more specific, stationary contact E is connected not only to grid 61 of tube 62, but also through a series circuit consisting of resistances 78 and 79 to a terminal 80 to which, as noted in Figure 1, an AGC voltage may be applied as a bias.

A capacitance 81 connected between resistance 79 and contact 80 serves to by-pass to ground A. C. signals which would otherwise cause fluctuations and therefore distortion in the output of triode 62. Cathode 82 of triode 62, as previously mentioned, is grounded while plate 83 of tube 62 is connected on one side to a series capacitance 84 and to contact D.

In parallel to the previously mentioned capacitance 64 is also a trimmer capacitor 85. On the other side, plate 83 of tube 62 is connected to cathode 90 of grounded grid triode 76 through a series inductance 91. Cathode 90 is connected to ground through capacitance 92 in series with a second capacitance 93. Grid 95 of triode 76 is grounded through resistance 96 connected between grid 95 and ground and is connected to the common point between capacitances 92 and 93 through series resistances 98 and 99. The common point between resistances 98 and 99 is connected through conductor 100 to a stationary contact 101 to which, during operation of the tuner, a $B+_2$ supply is connected.

To ensure proper operation of the R. F. amplifier, lead 103 between resistance 96 in grid 95 is by-passed to ground by means of a feed-through capacitor 105 and lead 100 is by-passed to ground through a feed-through capacitor 106.

Finally, plate 110 of triode 76 is connected to a trimmer capacitor 111 connected between plate 110 and ground and to a stationary contact F. The common point between capacitances 92 and 93 and resistance 99 is connected to another stationary contact G.

During operation of the tuner, a second panel 115 is connected to stationary contacts FG, KH, LM. Mounted on panel 115 are three tuning elements, in this case, three inductances 116, 117 and 118. Inductance 116 terminates at the panel mounted contacts 120 and 121, which engage respectively stationary contacts F and G. Inductance 117 terminates at panel mounted contacts 122 and 123 which engage stationary contacts K and H. Finally, inductance 118 terminates at movable contacts 124, 125 which engage stationary contacts L and M respectively.

While inductance 116 and inductance 117 are fixed inductances, inductance 118 is variable and generally of a slug tuned type. Since inductances 116, 117 and 118 are mounted in the same panel 115 and are not shielded from each other, there will be mutual coupling between the three inductances so that a signal appearing, for example, across inductance 116 would be coupled to inductance 117, and a signal appearing across inductance 118 would also be coupled to inductance 117.

Inductance 117 which is connected to stationary contacts K and H, is in the input of convertor tube, in this case a pentode 127, through a coupling capacitor 128 connected between contact K and grid 129 of pentode 127. Contact K is connected to ground through resistance 130 and grid 129 is connected to ground through the series combination of resistances 131 and 132. A terminal is brought out from the common point of resistances 131 and 132 to permit testing of the tuner and is therefore designated as T. P. in Figure 1.

Across the resistance combination 131 and 132 is connected a trimmer capacitor 133. Cathode 134 of converter 127 is connected to ground and to suppressor grid 135. Screen grid 136 of tube 127 is connected through a dropping resistance 138 to plate 139 of tube 127 and is by-passed to ground by capacitor 140 connected between screen grid 136 and ground.

The output from converter tube 127 is obtained through a circuit consisting of a variable inductance 141 and a capacitance 142 connected in series between plate 139 of tube 127 and ground. The I. F. output of the present tuner is actually obtained from across capacitor 142 and is brought out to a receptacle mounted on the chassis of the tuner. The common point between elements 141 and 142 is connected to lead 100 and therefore to the $B+_2$ supply through a dropping resistance 144.

Oscillator coil 118 is connected on one side through contact L to plate 145 of oscillator triode 146. The other side of inductance 118 is connected to the grid 147 of tube 146 through a coupling capacitor 148 and a grid leak resistance 149. Capacitor 148 is connected between contact M and grid 147 while grid leak resistor 149 is connected between ground and grid 147.

Also connected between ground and grid 147 is capacitor 150. While a fine tuning capacitor 152 is connected between stationary contact M and ground, another trimmer capacitor 155 connects contact L to ground. Also connected to ground is cathode 156 of oscillator tube 146. Contact M is connected to the $B+_1$ supply through a resistor 158, lead 159, terminal 160. Lead 159 is properly by-passed to ground by means of feed through capacitor 161.

Also connected to lead 159 is a resistance 163 connected on the other side to a contact M′ of the auxiliary assembly 170. Resistor 163 is also connected to a receptacle 171 mounted on the chassis of the present tuner. To another contact of the same receptacle is connected one side of filament 172 for the double triode tube 62—76. The other side of filament 172 is grounded. The ungrounded side of filament 172 is connected to filament 174 of tube 127—146 through a R. F. choke 175. Filament 174 is thus connected on one side to choke 175 and on the other side to ground.

A capacitance 176 is also connected to the ungrounded side of filament 174 to by-pass high frequencies. The common point between filament 172 and choke 175 is connected to a lead 178 which terminates at a contact 179 to which, during the operation of the tuner, a filament supply would be supplied. Lead 178 is also by-passed to ground through a feed through capacitor 180.

It should be apparent later, when describing the actual configuration of the V. H. F. tuner, that feed through capacitors 106, 161 and 180 are mounted through a shield 182 which is shown schematically in Figure 1.

It is now possible to describe the operation of this V. H. F. section of the present tuner. When, for example, channel 2 is desired, then the appropriate channel boards 60 and 115 are connected to the stationary contacts A, B, C, D, E, F, G, H, K, L, and M so that the elements mounted on panels 60 and 115 are those which correspond to the frequencies of channel 2 (54–60 mc.).

The signal of the correct frequency which appears on antenna 50 mixed with other undesired signals is selected by the input circuit of the R. F. amplifier 75. It will appear properly amplified at the output of this amplifier, namely across inductance 116.

At the same time, oscillator tube 146 produces signals of the correct frequency across inductance 118. The input signals and the oscillator signals are coupled into the input inductance 117 of converter tube 127 and mixed at converter 127 in a manner well known in the art so that across capacitance 142 will appear the desired signal at the desired I. F., at either 21 mc. or at 41 mc. depending on which I. F. is used in the television receiver itself.

In addition to contact M′, also contacts A′, B′, C′, D′, E′, F′, G′, H′, K′, and L′ are mounted on auxiliary assembly 170. The function of the circuits mounted on this auxiliary assembly 170 will be apparent hereinafter when the U. H. F. operation of the present tuner will be described.

Contacts A′ and B′ of assembly 70 are open and contact C′ is connected to the female of an I. F. coaxial connector 185 through a coil 186. Across contacts E′ and D′ is a coil 187 having a variable inductance.

Coils 186 and 187 form an I. F. transformer of which coil 186 is a primary and 187 is a tunable secondary. Connected across contact G′ and F′ is also a variable inductance 190 and a cross contacts H′ and K′ is connected a parallel circuit consisting of a variable inductance 191 in parallel with resistance 192. Contact L′ is left open and contact M′ as previously mentioned is connected to resistance 163.

The U. H. F. section of the present tuner consists of antenna terminals 200 and 201 mounted externally on the chassis of the present tuner. For proper operation of the present tuner, a U. H. F. antenna 202 balanced with respect to ground, is connected to terminals 200 and 201 through a balanced transmission line 203. Connected to terminal 201 is a capacitance 205 having the other side connected to a grounding plate 206. Terminal 200 is connected to a capacitance 207 in series with another capacitance 208 terminated at stationary contact N. Connected between the common point between capacitances 207 and 208 and ground is an inductance 210 and connected between stationary contact N and ground is an inductance 211. In parallel with the inductance 211 is a trimmer capacitance 212.

All the elements in the input to the U. H. F. tuner described up to now form a filtering circuit to essentially pass only U. H. F. signals and discriminate against V. H. F. signals. Another stationary contact P is connected to grounding member 206 and in alignment with contacts N and P is a third contact Q connected to ground through trimmer capacitor 213. Connected across contacts P and Q is an inductance 214 and connected across N and Q is a R. F. coupling capacitor 215 providing a constant band width for all the U. H. F. bands.

When the present tuner is operated as a U. H. F. tuner, a panel 220 is connected to contacts N, P, Q, R, S. Panel 220 carries tuning elements and more precisely it carries a plate 221 of a capacitor 222 where plate 221 is connected to a movable contact 223 through a coil 224. The other plate 225 of capacitor 222 is connected to contact 226.

Another plate 228 is connected to contact 229 through coil 230. Plate 228 forms with previously mentioned plate 225 a second capacitor 231. Also mounted on panel 220 is a third capacitor 232 having one of its plates 233 connected to a coil 234 and thence to a contact 235. The second plate 236 of capacitor 232 is connected to contact 237 through coil 238.

A lead 240 having probes 241 at its two ends serves as the injecting device between coil 234 and coil 230 for injecting an oscillator signal into a crystal mixer as described hereinafter.

During operation of the U. H. F. tuner, plate 221 is connected through coil 224, contacts 223 and N, to the input filter of the U. H. F. tuner. Plate 225 is connected to ground through contacts 226, P and plate 228 is connected to crystal mixer 239 through coil 230, contacts 229 and Q.

One side of crystal 239 is connected to an extension of the ungrounded plate of capacitor 213. The other side of crystal 239 is connected to coaxial cable 242 through feed-through capacitor 245. Feed-through capacitor 245 is provided at the crystal end with a receiving member cup-shaped for receiving one terminal 243 of crystal 239. Plate 233 of capacitor 232 is connected to the stationary contact R through coil 234 and movable contact 235 while plate 236 is connected to contact S through coil 238 and movable contact 277. Stationary contact R is connected to plate 247 of U. H. F. oscillator tube 248. Plate 247 is connected to power plug 249 through dropping resistance 250 and feed-through capacitor 251. Plate 247 is also connected to plate 252 of a capacitor assembly 253 which has its other plate 254 connected to contact S and grid 255 of tube 248 and a center conductive member 256 connected to ground and movable with respect to plates 252 and 254 to vary the capacitance between plates 252 and 254 and conductive element 256.

Grid 255 is connected to ground through a grid leak resistor 258 while cathode 259 of tube 248 is connected to ground through coil 260.

Filament 261 of tube 248 is connected on one side to coil 262 and thence to ground and on the other side to coil 263, feed through capacitor 264 and one contact of power plug 249. Connected across filament 261 is also a capacitor 265. Feed through capacitors 251 and 264 are mounted through a grounded shield shown in Figure 1 at 265 while feed through capacitor 245 is mounted through a vertical wall of bracket 422.

Panel 220 is mounted together with similar panels to form a U. H. F. turret. This turret is operated by a shaft or a sleeve depending on mechanical details and concentric with this shaft or sleeve, as will be seen hereinafter, is another controlling member carrying a series of dielectric plates, namely plates 267, 268 and 269, where plate 267 serves to vary the capacitance of capacitor 222, plate 268 varies the capacitance of capacitor 231, and plate 269 varies the capacitance of capacitor 232.

In addition, a third controlling member serves to move another dielectric plate 270 to vary by small amounts the capacitance of capacitor 232.

It should be noted that in the present invention, each panel 220 is used to pass and select a U. H. F. range encompassing ten U. H. F. channels.

It is now possible to describe the operation of the U. H. F. section of the present tuner. U. H. F. signals picked up by antenna 202 pass through the input filter described above and a particular U. H. F. channel is selected through the appropriate panel 220 and the appropriate positioning of plates 267 and 268.

This incoming U. H. F. signal is then applied to the input of crystal mixer 239. At the same time, dielectric plates 269 and 504 may be properly positioned with respect to plates 233 and 236 of capacitor 232 so as to cause oscillator 248 to generate the desired frequency signal. This signal is injected by means of injection device 240 into coil 230 and thence again into the input of crystal mixer 239.

When the frequency of oscillation of oscillator 248 and the frequency of the U. H. F. signal mix in crystal mixer 239, an output is obtained having the desired intermediate frequency of 21 or 45 mc. depending on the intermediate frequency of the television set itself. In the present invention, during U. H. F. reception, the cascode amplifier 75 and the converter 127 of the V. H. F. section are utilized as intermediate frequency amplifiers while the V. H. F. oscillator is made inoperative.

During U. H. F. reception, in fact contacts A—B—C—D—E—F—G—H—K—L—M are disconnected by means of a switching device described hereinafter in connection with Figures 23 and 24 from the contacts mounted on the V. H. F. turret and are caused to engage contacts A'B'C'E'F'G'H'K'L'M' respectively of assembly 170. When this connection is made, as can be clearly seen in Figure 1, contacts A and B will be open circuited. Contact C will be connected to coil 186 through the complementary contact C' and since a co-axial cable 242 engages the co-axial connection 185, the I. F. signal from crystal mixer 239 will appear across coil 186.

Across contacts E and D is now connected coil 187 through complementary contacts E' and D'. Coil 187 being mutually coupled to coil 186 will have across the terminal, E' and D' and therefore across its contacts E and D, the I. F. signal which is then applied to cascode amplifier 75 now operating as an I. F. amplifier, that is a fixed frequency amplifier. The output of cascode amplifier 75 appears across a coil 190 through engagement of its terminals F' and G' with stationary contacts F and G.

The signal across the inductive load 190 is applied through series network 193—194 to the input circuit 191—192 having its terminals H' and K' now connected to contacts H and K of the input of tube 127. Tube 127 now operates as another I. F. amplifier so that across capacitor 142 will now appear an I. F. signal containing the information existing in the original U. H. F. signal.

The signal appearing across capacitor 142 has now been considerably amplified by the cascode amplifier 75 and amplifier tube 127.

Since now no circuit element is connected between contacts L and M and contact M is connected to contact M' to short circuit resistances 158 and 163, oscillator tube 146 is made for all practical purposes inoperative so that it cannot produce interference or noise signals. Resistance 163 serves to keep alive the voltage to the U. H. F. oscillator tube 248 when the tuner is in V. H. F. position.

It should be noted that whether operating as a V. H. F. or U. H. F. tuner plug 249 and receptacle 171 are always properly connected together by means of conductors (not shown) in a manner well known in the art.

A side cut away view of the tuner of the present invention is shown in Figure 2. The V. H. F. turret 300 is seen to consist of antenna segments 60 and oscillator segments or panels 115. The panels are mounted to form turret 300 on three supporting discs: 298, 299 and 301. The two lateral ones 298 and 299 and the center one 301 are provided with appropriate notches such as 302 engageable by roller 303 carried by a spring member 304 secured to the metallic chassis 305 and extending through an opening 308 of member 304. For greater details on the construction of the V. H. F. turret reference is made to Patent No. 2,496,183 to Thias.

The three supporting discs for turret 300 are secured to a shaft 310 (see Figure 2*a*) extending through the whole length of the tuner and more particularly extending beyond the end wall 312 of chassis 305 in V-shaped opening 313 at its end 315. V-shaped opening 315 is engaged by a reentrant portion (not shown) of shaft 310 so that the V-shaped portion of end wall 312 acts as a bearing for shaft 310.

End wall 312 is stamped so that 2 pockets 316 and 317 are obtained on each side of opening 313.

Simple wire spring 318 is used to bias shaft 310 against the V-shaped opening 315 so that shaft 310 may not move away from its V-shaped bearing 315. Wire spring 318 engages at its ends the openings provided by pockets 316 and 317 and engages centrally the above-mentioned end of shaft 310.

The co-axial terminal 185 is mounted on the upper surface of chassis 305 and in Figure 2 co-axial terminal 185 is shown in engagement with the co-axial cable 242.

Also mounted on the upper surface of chassis 305 is the V. H. F. input circuit described in connection with Figure 1 of which only terminals 320 and 321 are visible in Figure 2. To terminals 320 and 321 are connected during its use, the two conductors of a balanced transmission line originating from V. H. F. antenna 50 as well-known in the art.

Similarly mounted on the upper surface of chassis 305 are the cascode amplifier tube 75 and the oscillator converter tube 127—146. Also visible on the upper surface 305 are trimmer capacitors described in connection with the V. H. F. section of Figure 1. Fixedly mounted on a plastic member 325 (see also Figure 25) and secured in the interior of the upper surface chassis 305 are the stationary contacts A—B—C—D—E—F—G—H—K—L—M.

These contacts are riveted at 326 to the plastic insulating support 325. Contacts A to E engage, during V. H. F. operation, movable contacts 66, 67, 69, 71 and 70 respectively of panel 60. The physical structure of panel 60 is shown in Figure 36.

In Figure 36 it will be seen that panel 60 consists of a plastic molding with its outwardly extending contacts 66, 67, 69, 71 and 70. The plastic molding is provided with supporting arms 328 and 329 which engage a coil form 330. Wound on the coil form are the two coils 65 and 68. More precisely coil 68 consists of two sections 68*a* and 68*b* having one of their ends connected to contacts 70 and 71 respectively, and the other ends connected to common contact 69 which during operation of the V. H. F. turret is connected to ground. Coil 65 is mounted close to coil 68 and its terminals are connected to the extensions of contacts 66 and 67.

The input and output coils 65 and 68 are thus properly isolated. Using isolating grid terminal also removes coupling capacity between the terminals themselves through the dielectric of both the stator and rotor boards.

It is also found that providing a centrally located ground contact 69 and by separating the two coils so that one is mounted close to the other but not over the other, it is found that the capacity to the secondary is greatly reduced. It can also be said that the position of the grounding contact 69 between the two coils of the input transformer 65—68, which are reverse helices, reduces stray capacity. Stationary contacts F to M engage during V. H. F. operation the turret mounted contacts 120—

121—123—122—124 and 125 respectively as shown also in Figure 1.

The physical structure of panel 115 is shown in Figure 37. It can be seen from that figure that panel 115 consists also of a plastic molding provided with the six contacts, 120—121—123—122 and 124—125. The plastic molding is supported with supporting arms 331 and 332 carrying a coil form 333.

On coil form 333 are wound the three coils 116—117 and 118. More specifically coil 116 is wound at one end of coil form 333 and its terminals are connected to terminals 120—121. Coil 117 is centrally mounted on coil form 333 and connected to contacts 122 and 123. Finally coil 118 is mounted at the other end of coil form 333 and its terminals are connected to contacts 124 and 125.

Coil form 333 is also provided with a slot 334 engaged by a wire spring member 335 secured in an appropriate way to the base of the plastic molding. Wire spring 335 engages slot 334 and thus serves as a positioning member or thread for the screw 336, movable in the interior coil form 333 on the side on which oscillator coil 118 is wound. Screw 336 is provided to permit changes in the inductance of coil 118 so as to obtain the desired frequency oscillation from oscillator tube 146.

Screw 336 for varying oscillator coil 118 can be moved from the front of this tuner, as described hereinafter, so that during installation of the television set, the serviceman may easily trim the oscillator coils so that they will operate at a desired frequency. The serviceman will be able to do so in the present tuner by just introducing a screw driver from the front of this tuner with the tuner set for V. H. F. operation.

Referring again to Figure 2, the U. H. F. turret 340 is formed by a series of panels 220 supported and mounted on end discs 341 and 342 (see also Figures 12, 13, 16, 18, and 19). Disc 341 is provided with a number of slots 344 rectangularly shaped to be engaged by an extension 345 of panels 220. In addition to having a number of slots 344 equal to the number of panels to be mounted on supporting disc 341, disc 341 has what may be called a V. H. F. position shown in Figure 13 at the V-shaped notch 346. Slightly to one side of notch 346 is an opening 347 also in disc 341 which, as seen hereinafter, permits adjustment of the V. H. F. oscillator coils from the front end of the tuner during V. H. F. reception. End plate 341 is metallic and thus serves also as the ground plate for the adjusting screws 348 for the oscillator capacitor 232.

Figure 7:
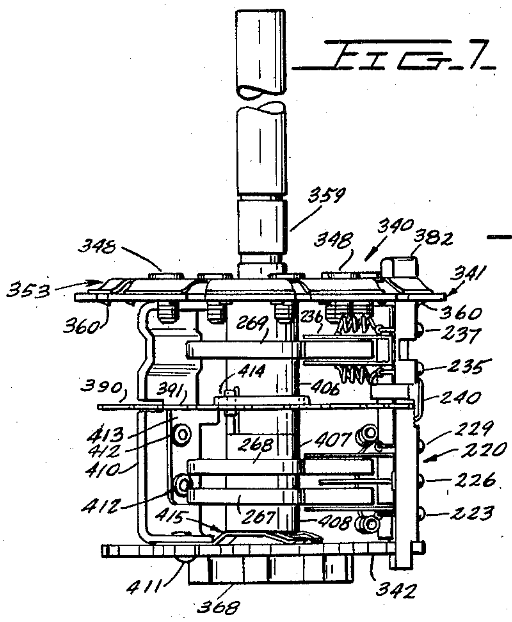
Figure 10:
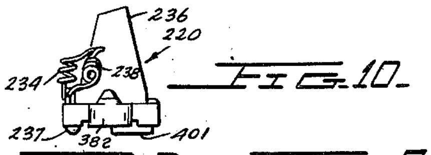
Figure 10 is a side view of the panels of Figure 8.
Figure 8:
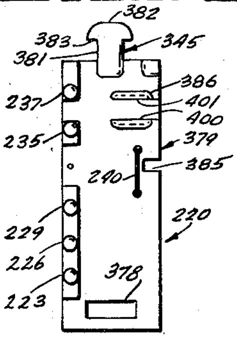
Figure 9:
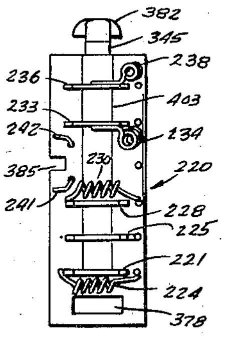
Figure 9 is a bottom view of the panels of Figure 8.

It may be seen, in fact, in Figure 7 that adjusting screws 348 after engaging conductive discs 341 extend close to plate 236 of oscillator capacitor 232 so that the position of adjusting screw 348 with respect to that of plate 236 will determine the amount of capacitance to ground between plate 236 of capacitor 232 and adjusting screw 348.

The adjusting screws 348 engage conductive disc 341 through appropriate threaded openings and are held against undesired movement by wire springs 350 and 351 appropriately bearing against the threads of adjusting screws 348. Riveted on the external part of disc 341 is a spring disc 353 shown in detail in Figures 14 and 15. Disc 353 is provided with openings 354 which are similar to openings 354 in disc 341 with the addition of a circular portion 355 which serves to permit screws 348 to go through spring discs 353 and engage conductive disc 351. Spring disc 353 is also provided with a larger opening 357 corresponding with notch 346 of disc 341.

Spring disc 353 as seen more clearly in Figure 15 is flat at the center portion 356 and is raised at 358 to form a V-shaped circular band. Spring disc 353 is secured to disc 341 in any known way, for example, by means of rivets.

Both spring member 353 and disc 341 are provided with an appropriately centrally positioned opening to permit their mounting on a shaft 359 (see Figures 2 and 7) which is actually a sleeve through which V. H. F. shaft 310 extends so as to permit control of the V. H. F. turret 300 from the front end of the television tuner.

In the back of disc 341 on each side of each opening 344 are small stamped out retaining elements 360 which, as described hereinafter, serve to retain panels 220 after mounting from moving in the radial direction. The back plate 342 consists of a disc provided with pairs of radially extending fingers 365. Fingers 365 are provided with an enlarged end or head 366 so that after each pair of fingers 365 is made to pass through slot 378 of panels 220, heads 366 will prevent motion of panel 220 away from disc 342 or will prevent radial motion of panels 220.

Disc 342 (Figure 12) is further provided with a centrally positioned cam surface 368 (see also Figure 16). Cam surface 368 is broken for a certain length to permit the insertion of a radially moving piece 369 having also notches such as 370 similar to notches 371 of cam surface 368. Member 369 can move radially since it is provided (see Figures 21 and 22) with longitudinal slot 373 which engages shaft 310 of the V. H. F. turret 300.

Member 369 is also provided with a raised portion 374. Member 369 is, therefore, so shaped that when sector 375 mounted on V. H. F. shaft 310 moves with respect to disc 342, it will engage for a certain angular range the shield or raised portion 374 of member 369 so as to move member 369 in the radial outer direction. When sector 375 does not engage shoulder 374 of member 369, appropriate spring means described hereinafter serve to return member 369 to a lower position as determined by the flat end of slot 373.

It was previously mentioned that U. H. F. panels 220 bridge discs 341 and 342 to form the turret. Panels 220 (see Figures 8, 9, 10, and 11) are formed of a dielectric base 379 which may be, for example, of high dielectric constant ceramic material. Dielectric base 379 is provided with an extending member 345 at one end and a slot 378 at the other end. Extension 345 is provided with a neck 381 and a head 382. Head 382 is provided on one side with shoulders 383 which serve to engage the raised portion 358 of spring disc 353 when panels 220 are mounted to form turret 340 on discs 341 and 342.

Panels 220 are provided on the outer surface with contacts 237, 235, 229, 226 and 223 (see also Figure 1) and with openings 385, 386. Opening 385 serves to permit an extension 390 (see Figure 30) of shielding plate 391 to engage during rotation of the U. H. F. turret 340 an appropriate grounding element 392 mounted stationarily on chassis 305 in its U. H. F. section. U. H. F. shield 391 is mounted parallel to the U. H. F. supporting discs 341 and 342 in the interior of the U. H. F. turret 350 so as to electrically isolate the tuning elements in the oscillator from the tuning elements of the preselector.

Opening 385 in panel 220 is, in fact, so located that a plate perpendicular to the panel at 385 will separate each panel into two sections, one consisting of plates 236 and 233 and the other of plates 221, 225 and 228. Plates 233 and 236 are the rotor mounted plates for oscillator capacitor 232, while plates 221, 225 and 228 are the plates for capacitors 222 and 231.

Mounted also on panel 220 is coil 238 connected to plate 236, coil 234 connected to plate 233, coil 230 connected to plate 228, coil 224 connected to plate 221. Plates 233 and 236 are provided with extensions 400 and 401, respectively, which protrude outwardly from panel 220 so as to permit, as hereinafter described in connection with Figures 30 and 31, fine tuning at ultra-high frequencies.

These extensions 400 and 401 pass through the previously mentioned openings 386. Also, as clearly shown in Figures 8 and 9, injecting device 240 consists of a conductive wire (see Figure 8) having coupling loops 241 and 242 at its two ends in close proximity to plates 228 and 233, respectively (see Figure 9), for coupling the output of the oscillator into mixer 239.

In this embodiment of the U. H. F. panels used in the present invention, the conductive plates are shown embedded in the plastic molding, the plastic molding being provided with a center longitudinal protruding portion 403 to permit accurate positioning of the conductive plates on panel 220.

When panels 220 are mounted on the supporting discs 341 and 342 (see Figures 7, 16, 30 and 31), opening 378 is engaged by fingers 365 so that the heads 366 of fingers 365 extend outwardly from turret 340 through opening 378. Also extending outwardly is the extension 390 and the capacitor plate extensions 400 and 401.

Extension 345, or better its neck 381, is introduced in slot 344 of disc 341 so that the shoulders 383 of extension 345 will be brought against portion 358 of spring member 353 so that spring portion 358 will bias panels 220 toward the front and since the interior side of disc 341 is provided with the small extension 360, each panel 220 once mounted cannot be removed through radial movement but must be first pressed against the bias of the spring portion 358 and then moved from the turret by radial movement.

By this means, panels 220 are firmly secured to form turret 340. In the interior of turret 340 and rigidly secured to shaft 310 are dielectric sleeves 406, 407 and 408 carrying, respectively, dielectric plates 269, 268, and 267 of capacitors 232, 231, and 222.

The front plate 341 of the U. H. F. turret 340, as previously mentioned, is secured to a sleeve or hollow shaft 359 so that rotation of the same will cause rotation of the U. H. F. turret 340.

In order to rigidly tie together discs 341, 342, a metallic bridge 410 is provided (see Figure 7) approximately in the position determined by notch 346 (Figure 13). This bar 410 is appropriately riveted such as at 411 to plates 342 and 341, also riveted through rivets 412 to an extension 413 of shielding disc 391.

When notch 346 is engaged by the positioning device of the detent roller as described hereinafter, then because of the position of bar 410 the U. H. F. turret will become inoperative and only the V. H. F. section will be operative so that it is possible to see now that notch 346 corresponds with the position of V. H. F. reception alone.

It should also be noted that in order to provide a really good grounding action and shielding action between the oscillator and the preselector portion of the U. H. F. turret, a flat conductive spring member 414 is connected on one side (not shown) to the shaft 310, while its flat end (see Figure 7) is appropriately bent so that it always bears against the interior portion of shield 391 and thus provides a means for grounding the shaft 310 at that point, shielding well one section of the U. H. F. tuner from the other and, therefore, improving the operation of the U. H. F. section.

It should also be noted that in order to position properly the structure consisting of sleeves 406, 407 and the dielectric plates 267, 268 and 269, the dielectric structure is biased toward the front by a U-shaped spring 415 secured to rear plate 342 in any appropriate way, for example, by means of the previously mentioned rivet 411.

The positioning of dielectric elements 267, 268, 269 longitudinally on shaft 305 in turret 340 is quite important in that their position with respect to the rotor mounted plates 233, 236, 221, 225 and 228 is critical if the tuner is to operate at the desired frequencies.

The U. H. F. turret 340 when mounted as shown in Figure 2 will have the opening 344 or the notch 346 of supporting disc 341 in engagement with the roller 417 mounted on a resilient finger 418. Finger 418 is rigidly secured to chassis 305 through a screw 419 and a positioning extension 423. Through the detent action provided by element 418 and roller 417 over the outer surface of disc 341, it is possible to accurately position contacts 223, 226, 229, 235, 237 and to accurately position panels 220 with respect to the stationary contacts of this U. H. F. turret.

Stationary contacts N, P, Q, R, S are mounted by means of rivets 420 to a dielectric supporting bar 421 (see Figure 25) which is in turn secured through bracket 422 to the chassis 305 of the present tuner. Mounted on the same bracket 422 and secured to it in any appropriate way is the grounding contact 392 for grounding shield 391 through its extension 390.

Secured to the front wall 425 of chassis 305 is an additional grounding contact 426 which is continuously engaged by the outwardly extending portions of conductive disc 341, thus providing a good ground for the disc 341 and, therefore, for the adjusting screws 348. Also mounted on the chassis and in position so as to be complementary and cooperating with shield 391 is a conductive shield 427 which extends transversely in chassis 305 to also divide the oscillator section of the U. H. F. tuner from the preselector section.

By the provision of shielding means 391 and 427 it is possible to reduce considerably any oscillator radiation. When the tuner is mounted, the panel mounted contacts bear against the kidney spring contacts N to S and through cooperation of roller 417 with notches 344 or 346, the rotary contacts will engage the stationary contacts N to S always at the desired preselected position so as never to change the inductance or the resistance of the path from the stationary contacts to the rotary contacts.

This is particularly important at ultra-high frequencies where any small shift of the contacts with respect to each other may produce detuning of the tuner.

It was previously mentioned that the stationary contacts A to M of the V. H. F. section are mounted on a dielectric or insulating member 325 secured to chassis 305 in any suitable way, for example, through rivets. Contacts A to M, shown in detail in Figures 26, 27, 28, and 29, are made of a conductive spring material and while in one portion 428 they are completely flat, at another portion 429 they are channeled and bent at the two edges. The other end 428 terminates with an opening 430 which is engaged by the rivet 326 for mounting on supporting member 325, but the flat member 428 continues at an angle to form portion 431 which as shown in Figure 28 is provided with an opening 432 to which electrical components may be secured by soldering.

Figure 29 is a detail cross-sectional view showing how the channeling of contacts A to M is made. Separating the two sections, one having contacts A to E, the other contacts F to M, that is the R. F. section from the oscillator section, is a shield 432 which in cooperation with detent disc 301 forms a shield between the oscillator section and the antenna section to reduce to the desired level oscillator radiation.

To make detent disc 301 a better grounding plate than would be obtainable through engagement of detent disc 301 by roller 303, a grounding spring contact 434 is secured to a bent portion 435 of stationary shield 432 so that at least one of the portions of disc 301 which extends from its average radius will engage stationary grounding contacts 434 and thus provide a better ground.

Contacts A to M may occupy two positions as can be seen in Figures 23 and 24. In Figure 23 there is shown the position for V. H. F. reception, that is, when contacts A to M engage the V. H. F. turret contacts described in connection with Figures 36 and 37.

Since spring contacts A to M are actually preloaded, they will engage the rotary contacts with sufficient spring bias so as to obtain electrically good contact engagement and since as shown in Figure 23 in the position shown in that figure the rotary contacts of panels 60 and 115 press on stationary contacts A to M, stationary contacts A to M are caused to deflect from the position at which they would otherwise make engagement with contacts A' to M' of auxiliary assembly 170 (see also Figure 1).

In other words, the rotary contacts of V. H. F. turret 300 in the V. H. F. position of the present tuner displace stationary contacts A to M so that engagement is broken between contacts A to M and contacts A' to M'.

During U. H. F. reception, on the other hand, when as described in connection with Figure 1, auxiliary assembly 170 is used as the stationary circuit of the V. H. F. section instead of the turret mounted elements while the turret is maintained at the same position, contacts A' to M' are moved upwardly in Figure 24 to engage the channeled portion 429 of contacts A to M. This movement or deflection of contacts A to M caused by the motion of auxiliary assembly 170 causes the bending of contacts A to M at their flat portion 428 as clearly seen in Figure 24.

Under such conditions, contacts A to M are biased against contacts A' to M' very strongly, but contact is broken between contacts A to M and the rotary contacts of the V. H. F. turret 300.

As described hereinafter, this contact change is made possible in the novel manner by the cam of the present invention.

The auxiliary assembly 170, the electrical components of which were described in connection with Figure 1, consists of an insulating board 440 carrying the auxiliary contacts A' to M'. Insulating support 440 is secured in its turn to a metallic member 442 which is provided with extensions 443, 444 of which extension 443 passes through the back wall 445 of chassis 405 and is pivoted there, while extension 444 passes through shield 446 between the V. H. F. section and the U. H. F. section and is also pivoted in an appropriate opening of shield 446.

Member 442 is angularly shaped so that while the portion 447 carries the electrical components in connection with Figure 1, the other portion 448 serves together with its extensions 443 and 444 as a means for operating auxiliary structure 170 in either one of its two positions. Portion 448 of conductive structure 442 is provided with the recess 449 to which a grounding spring contact 450 may be secured, for example, by soldering.

Also, plastic portion 440 is provided with a recess 451 in which an insulating button 452 is mounted in any suitable way. Insulating button 452 moves together with assembly 170. At one end of portion 448 is an angular extension 454 which is provided with an opening 455 engaged by a spring 456 secured on the other side to a rivet 457 fixed on shield 446.

Assembly 170 is also biased in its V. H. F. position and actually preloaded with respect to the V. H. F. position by a wire spring 460 secured to the back wall 445 of chassis 305. More precisely, wire spring 460 engages an opening 461 in back wall 445 at one end and at its other end engages an appropriate recess 462 in extension 443 of stationary assembly support 442. Wire spring 460 also engages a rivet 464 positioned in between opening 461 and extension 443 so that wire spring 460, considered originally straight, will have to bend in order to engage opening 462 of extension 443 and, therefore, will maintain auxiliary assembly 170 biased in one direction.

Referring now to Figure 25, when V. H. F. turret 300 is properly mounted in chassis 305 and assembly 170 is set in its inoperative or V. H. F. position (see Figure 23), then in any position of the V. H. F. turret, one notch 302 of position disk 301 will engage the insulating roller 452 due to the fact that roller 452 is mounted on the insulating base 440 and therefore moves together with assembly 170 from the position shown in Figure 24 to the position shown in Figure 23 as the operator moves appropriate dials from U. H. F. to V. H. F. reception.

It will be seen, referring to Figure 39, that every time the V. H. F. turret is moved by one channel, through action of disk 301, roller 452 is caused to move in a direction against that of springs 456 and 460. In other words, the whole assembly 170 will press down on contacts A to M at each rotation of turret 300, thus producing at each rotation a wiping and cleaning action on contacts A to M.

As seen hereinafter, a similar wiping or cleaning action is performed also during U. H. F. operation by the U. H. F. turret.

It was previously mentioned that disk 342 of U. H. F. turret 340 has at one end a cam surface 368. Cam surface 368 is engaged by a roller 480 (see Figures 23 and 24) which is biased against cam surface 368 by the action of spring 456 operating on sliding member 481. Sliding member 481 to which pin 480 is secured in any suitable way, for example by means of a rivet, is fork-shaped at its ends 482 and 483, of which the fork at 482 engages a positioning pin 484 which may be a rivet secured to the center shield 446.

The two forks at 482 and 483 are so shaped that while fork 482 permits member 481 to move only in its axial direction fork 483 serves to translate the longitudinal notch of member 481 into an angular motion of extension 486 and therefore auxiliary assembly 170.

This is seen in Figures 23 and 24. Figure 24 shows slidable member 481 in what we may call, with reference to Figure 24, its highest position, which as clearly shown there means that assembly 170 would be at one of its angular limits pressing on the contacts A to M against their biasing action. In Figure 23, on the other hand, slidable member 481 is shown in its lowest position or its V. H. F. position so that auxiliary assembly 170 occupies now the other limiting angular position. In this position, because of the presence of the V. H. F. turret 300, contacts A to M do not bear against contacts A' to M' of auxiliary assembly 170, but they bear against the contacts of the V. H. F. panels 60 and 115. This slidable movement is imparted to member 481 by the cam surface 368 acting on pin 480 at rotation of U. H. F. turret 340.

As can be seen from Figure 24, when a notch such as 371 engages pin 480, then slidable member 481 will be in its upper position, the upper position being the same regardless of which of the notches 371 is engaging pin 480. In one position, however, of U. H. F. turret 340, pin 480 will be engaged by member 369 or, better, notch 490 of member 369 will engage the pin 480 and be pushed down by pin 480 if the V. H. F. controlled sector 375 is not positioned directly against the shoulder 374 of member 369 as, for example, shown in Figure 24.

Figure 23 then shows the relative position of the cam mechanisms when sector 375 allows free longitudinal movement of member 369 in an appropriate groove 491 in the rear plate 342. This then corresponds to the V. H. F. position of the cam system.

It is possible now to describe the operation of the present tuner, especially when channels 11, 12 and 13 are desired. Starting from V. H. F. reception, the U. H. F. turret is first rotated until pin 480 engages notch 495. Now the distance from the bottom of notch 495 to the center of shaft 310 is less than the distance from the bottom of notches 371 to the same center of shaft 310 member 481 would also be at its lowest position.

This may be seen in Figure 40. When the cam mechanism is in this position, contacts A to M engage the rotary contacts of V. H. F. turret 300 while contacts A' to M' would be disconnected. If now shaft 305 is rotated, it will be positioned to receive all the twelve V. H. F.

channels corresponding to the twelve panels mounted on the V. H. F. turret 300.

It is to be understood that while a system with 12 V. H. F. channels is here described, this invention is applicable to systems using a different number of V. H. F. channels.

If, on the other hand, a U. H. F. channel is desired, U. H. F. turret 340 is rotated through its shaft 359 until the correct notch 371 engages pin 480. Under such conditions, assembly 170 is rotated counterclockwise with respect to the position shown in Figure 40 so that it takes a new position as shown in Figure 41.

In Figure 41, contacts A to M are removed from engagement with the contacts of the V. H. F. turret 300 and now engage contacts A' to M' of auxiliary assembly 170 to thus change the V. H. F. section into an I. F. amplifier as described in connection with Figure 1.

After rotation of U. H. F. turret for the selection of the desired U. H. F. band, V. H. F. shaft 305 is now operated so that at its rotation, plates 267, 268 and 269 are moved with respect to U. H. F. turret mounted capacitor plates 221, 225, 228, 233 and 236.

The dielectric plates 267, 268 and 269 and plates 221, 225, 228, 233 and 236 are so shaped that at any of the U. H. F. bands, an equal angular rotation of plates 267, 268 and 269 causes the selection of a U. H. F. channel. To give a specific example, plates 221, 225, 228, 233 and 236 of the U. H. F. panel corresponding to U. H. F. channels 30 to 39 are so shaped that at each position of the V. H. F. positioning disk 301, capacitors 222, 231 and 232 have the value or capacitance which would produce the selection of the desired U. H. F. channel located in the band between channels 30 and 39.

Since the V. H. F. detent disk 301 serves to position all the U. H. F. channels after the selection of the band by rotation of turret 340, equal rotation of dielectric plates 267, 268 and 269 rotatable with V. H. F. turret 300 must produce the tuning through an equal movement of channels in the U. H. F. region regardless of which U. H. F. panel 220 is made operative. This is achieved in the present invention essentially in the manner described in the copending application, Serial No. 325,514, filed December 12, 1952, by varying the shape of the conductive plates 221, 225, 228, 233 and 236 for each of the U. H. F. panels.

An important aspect of the present invention is that there are actually two different ways of obtaining channels 10, 11, 12 and 13 in the V. H. F. region. One method was mentioned in connection with the V. H. F. reception. Another consists of positioning the U. H. F. turret for reception of signals from channels numbered 10 to 19. In other words, U. H. F. turret 340 is first positioned so that the first panel in the present invention engages the stationary contacts N, P, Q, R, S.

Figure 24 shows the relative positions of the cam mechanisms when U. H. F. channels 14 to 19 are being selected by the present tuner. As can be seen from Figure 24, member 369 is here caused to move to its upper position and carry with it pin 480 by circular sector 375 bearing against shoulder 374 of member 369. Sector 375 will rotate as the operator moves the V. H. F. shaft and therefore the dielectric plates 267, 269 and 268 have reception of U. H. F. channels 14 to 19.

But the motion of section 375 is such that member 369 and therefore slidable member 481 through engagement with pin 480 remains in its upper position which corresponds, as previously mentioned, to U. H. F. reception.

When the operator now goes from channel 14 to 13, which as is well known, is the highest V. H. F. channel but is separated from the lowest U. H. F. channel by more than 200 megacycles, sector 375 permits member 369 to move downwardly as shown in Figure 23 so that contacts A to M now engage the contacts of panels 60 and 115 of the V. H. F. turret 300.

When the other channels 12, 11, and 10 are desired, sector 375 is of course rotated but its rotation no longer affects the position of member 369 and therefore of slidable member 481 until passing for example through channel 10, the operator returns to channel 19. In that case, sector 375 will push the slidable member 481 again in its upper position shown in Figure 24 and U. H. F. reception will be obtained.

To summarize the above, the cam of the present invention makes possible the reception of channels 10 to 13 even when the first panel of the U. H. F. turret is in its operative position so that no discontinuity is encountered as the operator goes from selection of channel 13 in the V. H. F. band to channel 14 in the U. H. F. band for which, as described in connection with Figure 1, quite different circuits are used.

In the present invention, fine tuning means are also provided for both the V. H. F. channels and the U. H. F. channels. The fine tuning means shown in Figure 1 at 152 for V. H. F. and at 270 for U. H. F. consists of variable capacitors. Variable capacitor 152 for V. H. F. as shown in Figure 25 consists of two stationary conductive plates 500 and 501 connected in the V. H. F. circuit as shown in Figure 1 having a movable dielectric plate 502 positioned between them. Dielectric plate 502 is mounted on a shaft 503 which carries in the U. H. F. section another dielectric plate 504 which moves (see Figures 30 and 31) between extensions 400 and 401 of plates 233 and 236. Shaft 503 extends through front wall 425 of chassis 305 and is there bent at an angle so that its extension 507 may be engaged by two sectors 508 and 509 facing each other and secured to each other on extension 507 by appropriate means, for example rivets 510.

Sectors 508 and 509 which can be seen in detail in Figure 34 and Figure 35 are each shaped so as to have at one end a bent portion 512 which, referring now to Figure 31, serves as a stop for the rotation not only of member 508—509, but also of shaft 503. Member 508—509 engage, sandwiched between their frictional portions 513, disk 514 secured to a sleeve 515. It is easily seen that rotation of sleeve 515 will cause similar rotation of disk 514 and therefore an opposite rotation of member 508—509 producing through shaft 503 a motion of dielectric members 270 and 504 to permit the desired fine tuning.

When, as seen in Figure 31, disk 514 engages the stop member 512, a rotation of sleeve 515 in the same direction will not cause any movement of shaft 503. Obviously, the same will occur at the other end of member 508—509.

By means of stops 512, it is thus possible to limit the travel of fine tuning plates 270 and 504 regardless of the amount of rotation to which shaft 515 may be subjected.

It should be noted that members 508 and 509 are exactly equal to each other and may all be obtained by a single stamping operation. After the stamping operation, two of such members, namely 508 and 509, are placed facing each other to form the structure shown in Figures 30, 31, 34 and 35.

The front end 425 of chassis 305 is provided with pockets 520, 521 obtained by stamping of front end 425. A wire spring 522 engages the two pockets 520 and 521 at its two ends and shaft 359 of U. H. F. turret 340 intermediate with respect to the two ends.

Shaft 310 of V. H. F. turret 300, as previously mentioned, is concentric with sleeve 359 and in the interior of sleeve 359. External to but concentric with sleeve 359 is the fine tuning sleeve 515.

Also referring to Figure 32, it will there be seen that tube 248 shown in the figure with its shield on is mounted at an angle on the top surface of chassis 305. This mounting permits not only the positioning of the tuner close to the front end of the television receiver where, as is well-known, the cathode ray tube has its maximum dimensions but permits also accessibility to the trimming elements by a serviceman.

Referring now to Figures 3, 4, and 5, it will there be seen that tubes 75, 127—146 and 248 are all mounted on the top surface of chassis 305. Also visible from the top surface of chassis 305 is the V. H. F. fine tuning plate 502 for variable capacitor 152. All the adjustable or trimming elements are also mounted on this top surface of the chassis 305 so as to permit adjustment of the tuner by a serviceman, when the tuner is mounted in a television receiver. Referring particularly to Figure 4, coaxial connector 185 is there shown mounted. Connector 185 is of a kind well-known in the art and will not, therefore, be described here.

Also visible in Figure 4 is the female receptacle 171 and the male 249 (see also Figure 1) which serve to provide D. C. and filament supply voltages to U. H. F. tube 248.

Also in Figure 4 is a trimmer capacitor consisting of a ceramic dielectric cylinder 530, a washer 531 and a screw 532. Ceramic cylinder 530 is appropriately coated externally at 534 so that the combination of screw 532, ceramic cylinder 530 and coating 534 forms a capacitor and since screw 532 is at ground potential through engagement of washer 531 with the top surface of chassis 305, then capacitor 532—530—534 will be a grounded trimmer capacitor It should be noted that capacitor 532—530—534 corresponds to capacitor 155 in the schematic diagram of Figure 1.

Referring now to the U. H. F. section (see Figures 3, 5, and 6) it will there be seen that the top surface of chassis 305 carries an insulating base 550 through which extend terminals 200 and 201 (see also Figure 1) to which the transmission line from the U. H. F. antenna (not shown) will be connected during operation of the tuner.

Contact 201 (see Figure 42) is mounted on metallic cylinder or rivet 551 which terminates in an expanded portion 552. A dielectric piece 553 of the same shape as expanded portion 552, namely circular, is positioned between the expanded portion 552 and the top plate of chassis 305. Thus, terminal 201 connected to one side of capacitor 205 has as its conductive element rivet 551—552 and the top plate of chassis 305 and as dielectric the insulating member 554 positioned between them.

Terminal 200 passes through a slot 555 in top plate or chassis 305 and insulating base 550 and is thus electrically insulated from the metallic chassis 305. Terminal 200 as shown in Figure 5 terminates as one plate of capacitor 207. The other plate 556 is a rectangular shaped conductive member separated from terminal 200 by a dielectric 557. To plate 556 is connected coil 210. Plate 556 is in turn separated from plate 557 by also appropriately shaped dielectric plates 558.

Plate 557 is connected to coil 211 to form capacitor 208 connected between coil 210 and coil 211. Between plate 557 and the conductive bracket 422 is a stack of insulating plates 560.

Holding structure 551—556—558—557—560 and securing it to bracket 422 is a nylon screw 561. By this particular construction it is possible to obtain the input U. H. F. filter described in connection with Figure 1 in a simple and economical way.

Also visible in the top view of the present tuner is the U. H. F. crystal mixer 239. Crystal mixer 239 is mounted on one side directly into the center conductive cylinder of feed through capacitor 245 or better one terminal of crystal 239 is introduced into and electrically connected to feed through capacitor 245 mounted through the vertical portion 563 of supporting bracket 422.

On the other side crystal 239 is supported by a metallic bracket 564 provided with a forked end 565 which can receive the other terminal of crystal 239. Bracket 564 is essentially U-shaped but provided with a bent portion 566. Bracket 564 is mounted on plastic support 421 to which contacts N, P, Q are mounted. In Figure 6 only contact N is shown.

Metallic bracket 422 also serves as support for a metallic member 423 which may be an integral piece with bracket 422. Bent portion 566, and metallic member 423 are provided with an appropriate opening centrally located for engagement by an adjusting screw 570 made of insulating material such as nylon (see Figure 5). A dielectric 569 is positioned between metallic member 423 and bent portion 566. Between adjusting screw 570 and bent portion 566 is positioned an insulating washer 571.

The function of bent portion 566 is to maintain screw 570 in a desired position after it has been set, and the function of screw 570 is to vary the capacitance to ground of the point to which crystal mixer 239 is connected, this capacitance being shown in Figure 1 at 213.

Therefore, by means of the simple bracket arrangement shown in Figure 6 for supporting crystal mixer 239 it is also possible to provide a means for varying capacitor element 213 utilizing the same bracket for this purpose.

It should be noted that the dielectric material referred to above and denoted by 557, 558 and 560 will be selected according to design consideration of the tuner.

Finally, referring to Figures 2, 16, 32 and 33, it will there be seen that chassis 305 housing turrets 300 and 340 is completely enclosed by means of an appropriately shaped member or cover 600 which, as shown in particular in Figure 16, is shaped in its upper part in the form of clips such as at 601 and 602 which in the assembled tuner engage the vertical longitudinal walls 604 and 605 of chassis 305 from the interior.

It should be also noted that the three walls of chassis 305, namely external walls 312 and 425 and their intermediate shield 446 are shaped in the lower part as truncated V's so that they closely approximate the cylindrical shape of the turrets 300 and 340. Cover 600 being complementary to these walls 312, 425 and 446 is similarly shaped so that the tuner of the present invention will have relatively small dimensions and will be completely shielded and self-enclosed.

In one embodiment of the present invention, the following magnitudes for the electrical constants and the following tubes were used:

| | | |
|---|---|---|
| Capacitor **51** | micromicrofarads | 5 |
| Capacitor **54** | do | 68 |
| Capacitor **57** | do | 68 |
| Resistor **78** | kilo-ohms | 22 |
| Capacitor **64** | micromicrofarads | 5.5 |
| Capacitor **85** | do | .5–3 |
| Capacitor **184** | do | 3 |
| Tube **75** | | 6BZ7 |
| Resistor **96** | kilo-ohms | 270 |
| Resistor **98** | do | 180 |
| Capacitor **105** | micromicrofarads | 800 |
| Capacitor **92** | do | 1.5 |
| Capacitor **93** | do | 47 |
| Resistor **99** | ohms | 680 |
| Capacitor **111** | micromicrofarads | .5–3 |
| Resistor **79** | kilo-ohms | 47 |
| Capacitor **81** | micromicrofarads | 1500 |
| Capacitor **130** | kilo-ohms | 15 |
| Capacitor **128** | micromicrofarads | 47 |
| Capacitor **133** | do | .5–3 |
| Resistor **131** | kilo-ohms | 33 |
| Resistor **132** | do | 220 |
| Tubes **127—146** | | 6U8 |
| Resistor **138** | kilo-ohms | 100 |
| Capacitor **140** | micromicrofarads | 220 |
| Capacitor **142** | do | 68 |
| Resistor **144** | kilo-ohms | 8.2 |
| Capacitor **106** | micromicrofarads | 800 |
| Capacitor **148** | do | 10 |
| Resistor **149** | kilo-ohms | 10 |
| Capacitor **150** | micromicrofarads | 5 |

| | | |
|---|---|---|
| Capacitor 155 | do | .5–3 |
| Resistor 158 | kilo-ohms | 3.3 |
| Capacitor 161 | micromicrofarads | 800 |
| Resistor 163 | kilo-ohms | 33 |
| Capacitor 180 | micromicrofarads | 800 |
| Capacitor 176 | do | 1500 |
| $B+_2$ | volts | +240–260 |
| $B+_1$ | do | +145–155 |
| Fil | volts A. C. | 6.3 |
| Resistor 192 | kilo-ohms | 5.6 |
| Resistor 193 | ohms | 10 |
| Capacitor 194 | micromicrofarads | 3.6 |
| Capacitor 205 | do | 3 |
| Capacitor 207 | do | 1 |
| Capacitor 208 | do | 2 |
| Crystal 239 | | 1N82 |
| Tube 248 | | 6T4 |
| Resistor 258 | kilo-ohms | 10 |
| Capacitor 265 | micromicrofarads | 1500 |
| Resistor 250 | kilo-ohms | 1 |
| Capacitor 245 | micromicrofarads | 10 |
| Capacitor 251 | do | 800 |
| Capacitor 264 | do | 800 |

In the foregoing the invention has been described solely in connection with specific illustrative embodiments thereof. Since many variations and modifications will now be obvious to those skilled in the art, it is preferred to be bound not by the specific disclosures herein contained but only by the appended claims.

I claim:

1. In combination, a V. H. F. tuner, a shaft, said tuner being mounted on and rotatable with said shaft, a U. H. F. tuner, a second shaft, said U. H. F. tuner being mounted and rotatable with said second shaft, a cam mounted on and rotatable with said first V. H. F. shaft, a cam follower for said cam mounted on and rotatable with said U. H. F. tuner shaft, a second cam follower, said U. H. F. tuner shaft being rotatable with respect to said second cam follower, said first cam follower being sometimes in non-operative relation with respect to said second cam follower when said U. H. F. tuning shaft is in a predetermined non-operating position, rotation of said V. H. F. shaft having no effect during such positioning on said second cam follower, said U. H. F. turret and the first cam follower on the one hand, and said second cam follower, on the other hand, being movable angularly relative to each other to bring said second follower into operative relation with respect to said first cam follower, said V. H. F. shaft, when thereafter rotated, operating said second cam follower radially in the predetermined angular position of the V. H. F. shaft.

2. In combination, a V. H. F. tuner, a V. H. F. shaft, said V. H. F. tuner being controlled by rotation of said shaft, a cam mounted on and rotatable with said V. H. F. shaft, a U. H. F. tuner, a U. H. F. shaft, said U. H. F. tuner being controlled by rotation of said U. H. F. shaft, a cam follower, for said first mentioned cam mounted on and rotatable with said U. H. F., said follower having a cammed surface, a second cam follower, electronic circuit connections including a set of V. H. F. contacts for providing circuit connections to said V. H. F. turret as said V. H. F. turret rotates, a rocking bar for engaging said V. H. F. contacts to operate said contacts out of engagement with said V. H. F. turret, a lever connection from said second cam follower to said rocking bar to engage and move said V. H. F. contacts out of engagement with said V. H. F. turret, said first cam follower and its cammed surface being normally out of cooperative relation with said second cam follower when said U. H. F. turret is in a predetermined angular position, said U. H. F. turret and said first cam follower being rotatable with respect to said second cam follower to bring said second cam follower and said first cam follower into cooperative relationship, rotation of said V. H. F. shaft over a predetermined angular range while said first and second cam followers are in cooperative relationship operating said second cam follower to operate said rocking bar and said V. H. F. contacts out of engagement with said turret.

3. In combination, a V. H. F. turret having removable panels mounted thereon, each of said panels containing electronic circuits and contacts therefor, a V. H. F. shaft, said V. H. F. turret being mounted on and rotatable with said V. H. F. shaft, a U. H. F. turret having removable panels, each of said panels having electronic circuits and contacts thereon, a U. H. F. shaft, said U. H. F. turret being mounted on and rotatable with said U. H. F. shaft, a group of electrical contacts for normally making contact connection to said V. H. F. turret contacts, a rocking arm, electronic circuits mounted on said rocking arm, said rocking arm having contacts for cooperating with said first mentioned contacts, a cam follower on said U. H. F. turret and rotatable therewith for cooperating with said V. H. F. cam and having a cammed surface thereat, a cammed surface mounted on said U. H. F. turret and rotatable therewith, a second cam follower cooperating with said first cam follower and its cammed surface and said third cammed surface, said cam follower, when said U. H. F. turret is in a predetermined angular position, being non-operative on its associated second cam follower when said U. H. F. turret is in a predetermined angular position, said V. H. F. contact members engaging its associated contacts on said removable panels of said V. H. F. turret for angular rotation of said V. H. F. turret, said U. H. F. turret when rotated from said predetermined position being operable to bring into cooperative relationship said second cam follower, said first cam follower and said first cam, said first cam on rotation of said V. H. F. turret in a predetermined angular range thereupon operating said second cam follower to operate said contact members out of engagement with the contacts on said V. H. F. turret and into engagement with a second electronic circuit.

4. In a television tuner, a V. H. F. turret, a U. H. F. turret, a U. H. F. cam surface mounted on said U. H. F. turret and having a sector radially slidable to correspond in position to the remainder of the U. H. F. cam surface, a V. H. F. cam surface, said slidable sector acting as a follower for said second cam surface, said V. H. F. turret being rotatable to selectively select nine of a plurality of V. H. F. channels while said U. H. F. tuner is maintained non-operative, said slidable sector being operated to its U. H. F. position when said U. H. F. turret is in position other than positions corresponding to channels 10 to 13.

References Cited in the file of this patent

UNITED STATES PATENTS

| | | |
|---|---|---|
| 1,695,479 | Bennett | Dec. 18, 1928 |
| 1,785,736 | Hess | Dec. 23, 1930 |
| 2,108,608 | Noller | Feb. 15, 1938 |
| 2,443,935 | Shea | June 22, 1948 |
| 2,515,078 | Cowardin | July 11, 1950 |
| 2,566,746 | Polydoroff | Sept. 4, 1951 |
| 2,567,860 | Shapiro | Sept. 11, 1951 |
| 2,596,117 | Bell et al. | May 13, 1952 |
| 2,665,377 | Krepps | Jan. 5, 1954 |
| 2,692,919 | Cohen | Oct. 26, 1954 |
| 2,750,496 | Horowitz | July 12, 1956 |

FOREIGN PATENTS

| | | |
|---|---|---|
| 508,574 | Germany | Sept. 29, 1930 |